(12) United States Patent
Trinh et al.

(10) Patent No.: US 12,178,147 B2
(45) Date of Patent: Dec. 24, 2024

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Hai-Dang Trinh, Hsinchu (TW); Fa-Shen Jiang, Taoyuan (TW); Hsing-Lien Lin, Hsin-Chu (TW); Chii-Ming Wu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/046,924

(22) Filed: Oct. 16, 2022

(65) Prior Publication Data

US 2023/0062897 A1 Mar. 2, 2023

Related U.S. Application Data

(60) Division of application No. 16/657,797, filed on Oct. 18, 2019, now Pat. No. 11,476,416, which is a continuation-in-part of application No. 15/939,864, filed on Mar. 29, 2018, now Pat. No. 11,437,573.

(51) Int. Cl.
*H10N 70/00* (2023.01)

(52) U.S. Cl.
CPC ....... *H10N 70/8413* (2023.02); *H10N 70/011* (2023.02); *H10N 70/861* (2023.02); *H10N 70/883* (2023.02)

(58) Field of Classification Search
CPC .................................................. H10N 70/861
See application file for complete search history.

(56) References Cited

U.S. PATENT DOCUMENTS

| 8,866,122 B1 | 10/2014 | Lee et al. |
| 9,224,947 B1 | 12/2015 | Chang et al. |
| 9,799,705 B1 | 10/2017 | Yi et al. |
| 2005/0152179 A1 | 7/2005 | Katti |

(Continued)

FOREIGN PATENT DOCUMENTS

| CN | 101794861 A | 8/2010 |
| CN | 106158899 A | 11/2016 |

(Continued)

OTHER PUBLICATIONS

US20160064664A1 is the US counterpart of CN106158899A.

(Continued)

*Primary Examiner* — Peter M Albrecht
(74) *Attorney, Agent, or Firm* — WPAT LAW; Anthony King

(57) ABSTRACT

A semiconductor device includes a diffusion barrier structure, a bottom electrode, a top electrode, a switching layer and a capping layer. The bottom electrode is over the diffusion barrier structure. The top electrode is over the bottom electrode. The switching layer is between the bottom electrode and the top electrode, and configured to store data. The capping layer is between the switching layer and the top electrode. The diffusion barrier structure includes a multiple-layer structure. A thermal conductivity of the diffusion barrier structure is greater than approximately 20 W/mK.

20 Claims, 34 Drawing Sheets

(56) References Cited

U.S. PATENT DOCUMENTS

| | | | |
|---|---|---|---|
| 2006/0183327 A1* | 8/2006 | Moon | H01L 21/76856 |
| | | | 438/687 |
| 2009/0218567 A1 | 9/2009 | Mathew et al. | |
| 2011/0001116 A1 | 1/2011 | Greene et al. | |
| 2012/0091420 A1 | 4/2012 | Kusai et al. | |
| 2012/0218806 A1 | 8/2012 | Liu et al. | |
| 2014/0103282 A1* | 4/2014 | Wang | H10N 70/826 |
| | | | 257/4 |
| 2014/0203236 A1 | 7/2014 | Chen et al. | |
| 2014/0264225 A1 | 9/2014 | Arayashiki | |
| 2017/0117463 A1 | 4/2017 | Chen | |
| 2018/0301626 A1* | 10/2018 | Trinh | H10N 70/826 |
| 2019/0036014 A1 | 1/2019 | Ha | |
| 2019/0157553 A1* | 5/2019 | Trinh | H10N 70/826 |

FOREIGN PATENT DOCUMENTS

| | | |
|---|---|---|
| CN | 106611815 A | 5/2017 |
| CN | 107591479 A | 1/2018 |
| CN | 110323331 A | 10/2019 |

OTHER PUBLICATIONS

US20170117464A1 is the US counterpart of CN106611815A.
US20100187493A1 is the US counterpart of CN101794861A.
US9716223B1 is the US counterpart of CN107591479A.
U.S. Pat. No. 11,437,573 B2 is the US counterpart of CN 110323331 A.

* cited by examiner

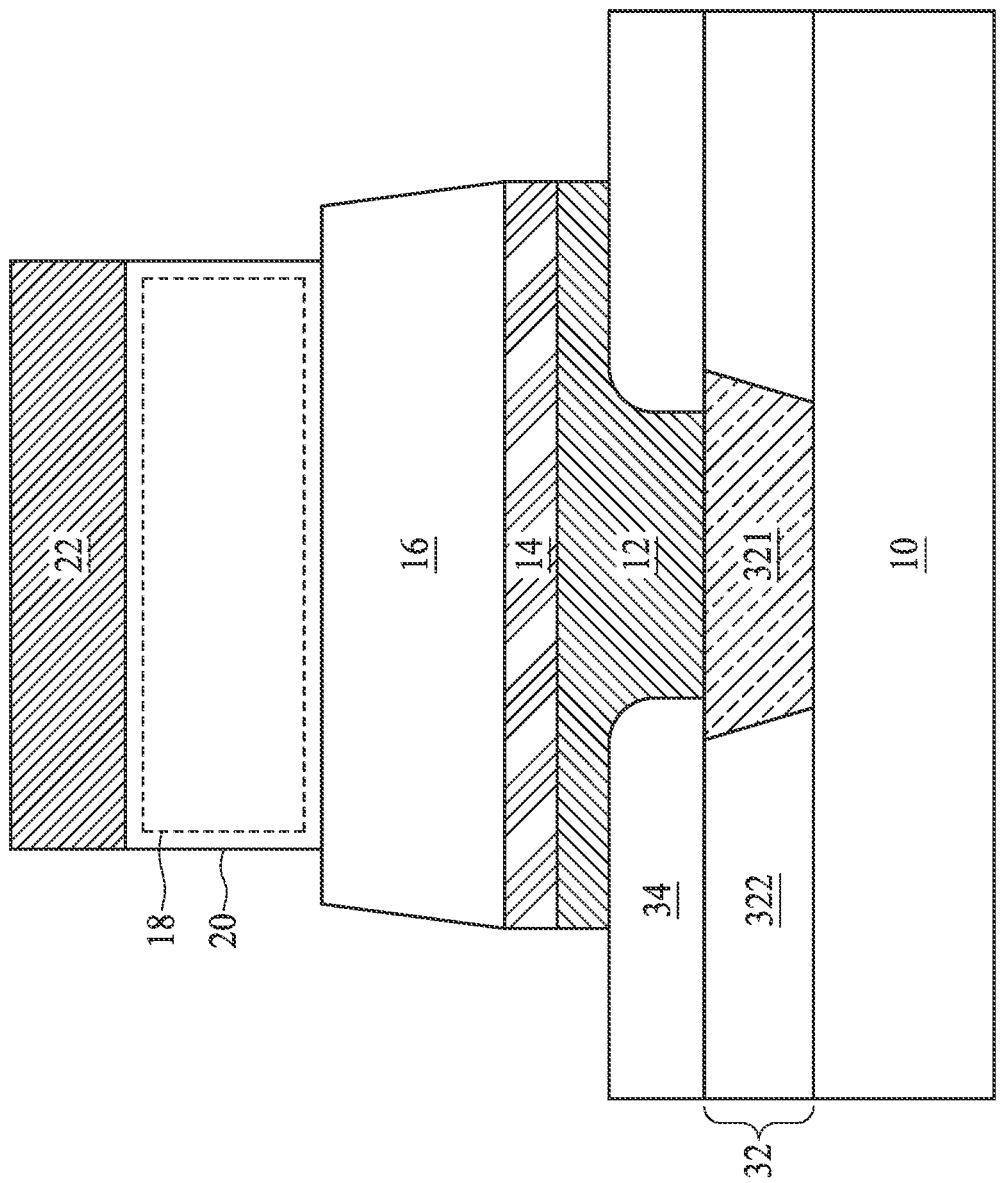

SEMICONDUCTOR DEVICE AND METHOD FOR MANUFACTURING THE SAME

CROSS REFERENCE TO RELATED APPLICATION

This application is a divisional application of U.S. patent application Ser. No. 16/657,797 filed on Oct. 18, 2019, entitled of "SEMICONDUCTOR DEVICE AND METHOD FOR MANUFACTURING THE SAME", which is a continuation-in-part of, and claims the priority benefit of, commonly-owned U.S. patent application Ser. No. 15/939,864 entitled "SEMICONDUCTOR DEVICE AND METHOD FOR MANUFACTURING THE SAME" filed on Mar. 29, 2018, the entire contents of all of which are hereby incorporated by reference.

BACKGROUND

Resistive random access memory (RRAM) and conductive bridge random access memory (CBRAM) are promising candidates for next generation non-volatile memory technology due to their simple structure and compatibility with complementary metal-oxide-semiconductor (CMOS) logic fabrication processes. The RRAM and CBRAM however, still suffer from degradation of switching window, switching time during cycling.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 6A, FIG. 6B, FIG. 6C, FIG. 6D, FIG. 6E, FIG. 6F and FIG. 6G are schematic views at one of various operations of manufacturing a semiconductor device according to one or more embodiments of the present disclosure.

DETAILED DESCRIPTION

Figure 1:
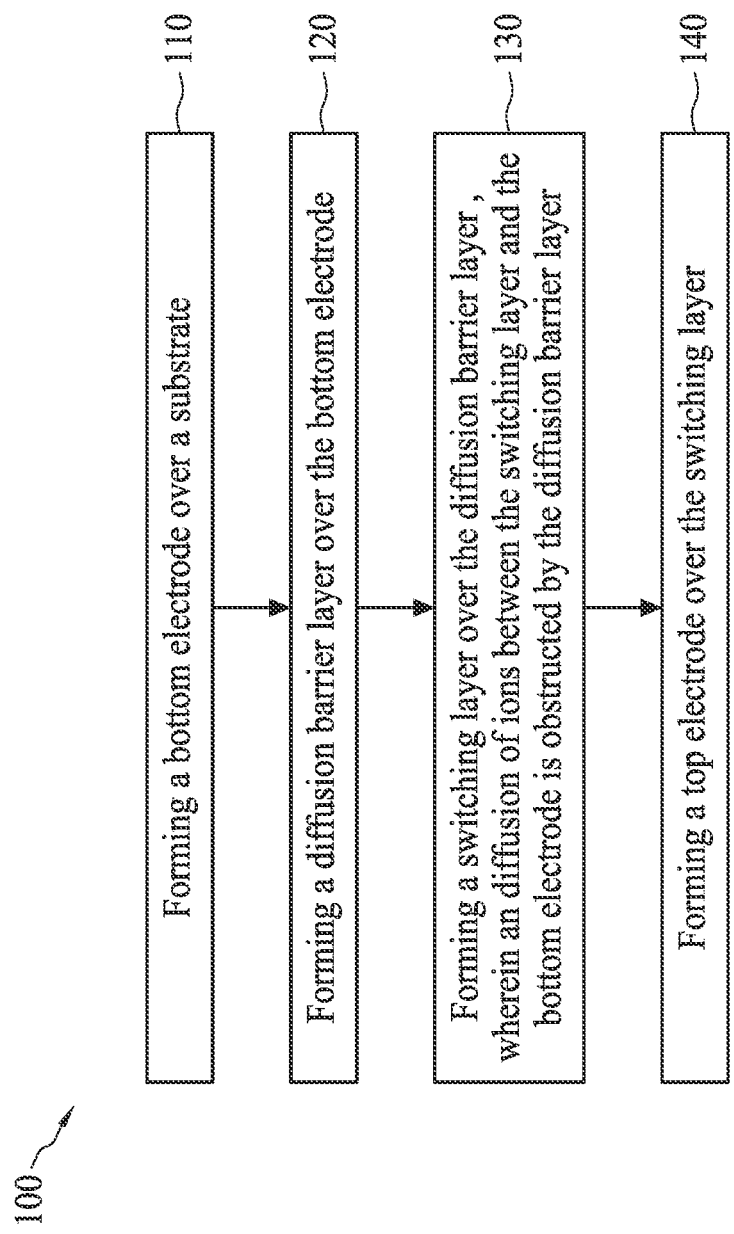
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, a semiconductor device includes a diffusion barrier layer interposed between the bottom electrode and the switching layer. The material of the diffusion barrier layer is selected to be inert or less reactive with respect to ions such as oxygen ions or active ions, and thus the diffusion barrier layer can help to prevent or retard permeability of oxygen ions or active ions during cycling and baking. The diffusion barrier layer can improve the cycling and retention performance of semiconductor device. Accordingly, the switching window can be increased after cycling and baking.

FIG. 1 is a flow chart illustrating a method for manufacturing a semiconductor device according to various aspects of one or more embodiments of the present disclosure. The method 100 begins with operation 110 in which a bottom electrode is formed over a substrate. The method 100 proceeds with operation 120 in which a diffusion barrier layer is formed over the bottom electrode. The method 100 continues with operation 130 in which a switching layer is formed over the diffusion barrier layer. The diffusion of ions between the switching layer and the bottom electrode is obstructed by the diffusion barrier layer. The method 100 proceeds with operation 140 in which a top electrode is formed over the switching layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
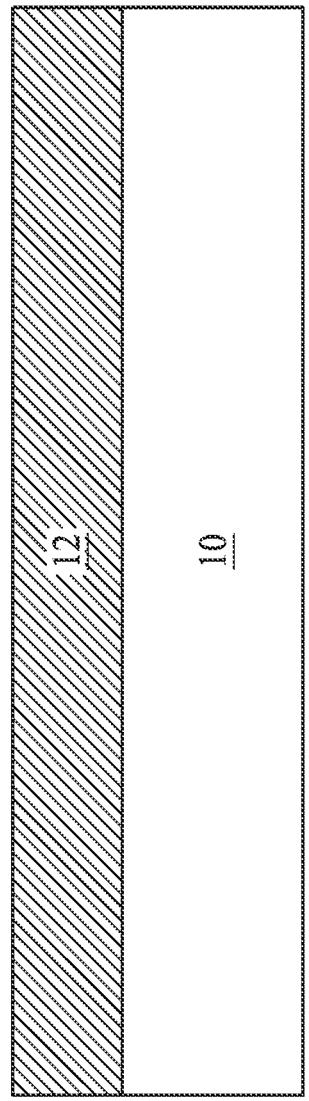
FIG. 2 and FIG. 3 are schematic views at one of various operations of manufacturing a semiconductor device according to one or more embodiments of the present disclosure.
Figure 3:
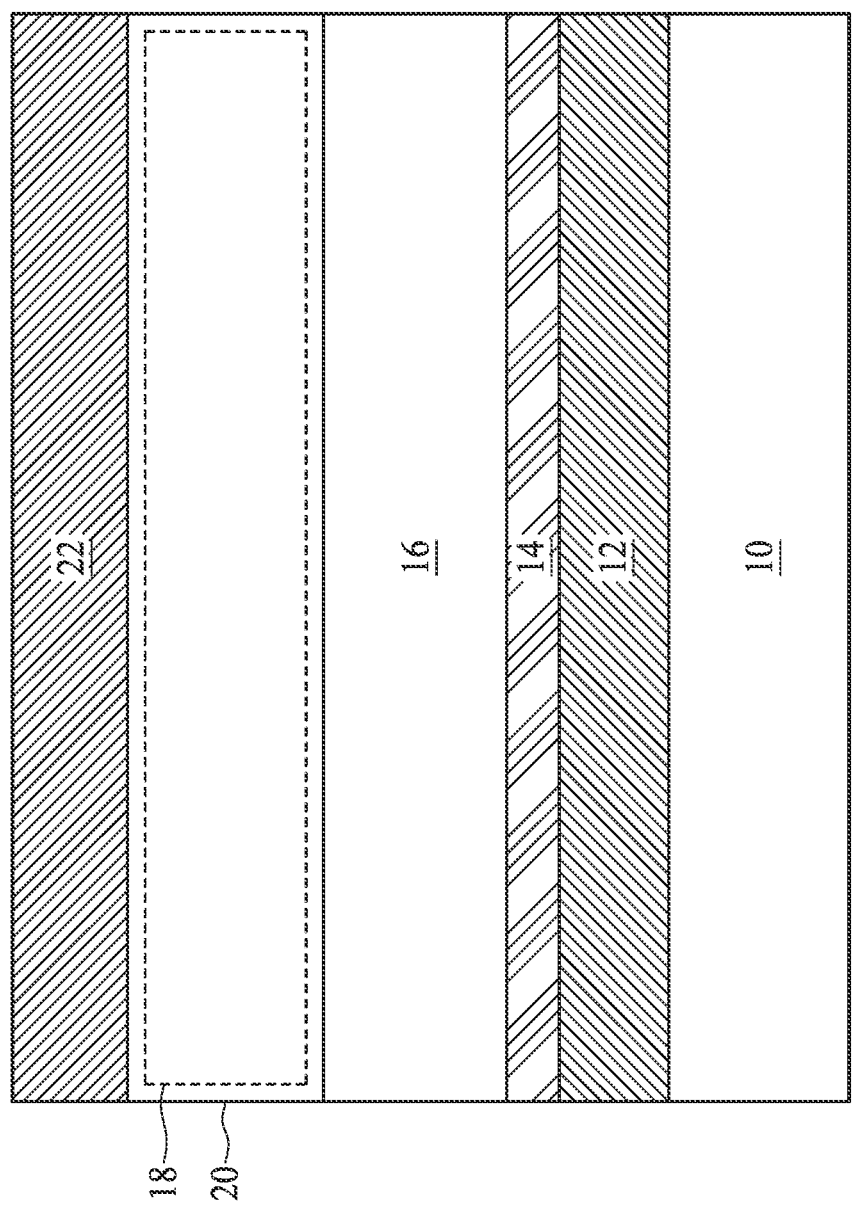

FIG. 2 and FIG. 3 are schematic views at one of various operations of manufacturing a semiconductor device according to one or more embodiments of the present disclosure. As shown in FIG. 2, a substrate 10 is received. The substrate 10 may include a semiconductor substrate. In some embodiments, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof.

In some embodiments, semiconductor components such as transistor components, electronic components such as resistor components, capacitor components, or inductor components, and circuit layers may be formed in or over the substrate 10.

As shown in FIG. 2, a bottom electrode 12 is formed over the substrate 10. The bottom electrode 12 is formed from a conductive material. Examples of the conductive material for the bottom electrode 12 may include, but are not limited to, metal nitride such as titanium nitride, tantalum nitride or the like, doped semiconductive material such as polycrystalline silicon or the like, and metal such as gold, tungsten or the like. In some embodiments, the bottom electrode 12 may be electrically connected to the semiconductor components, the electronic components and/or the circuit layers formed on the substrate 10.

As shown in FIG. 3, a switching layer 16 is formed over the bottom electrode 12. A top electrode 22 is formed over the switching layer 16. The switching layer 16 may include a data storage region configured to store data. In some embodiments, the switching layer 16 may be a data storage region of a resistive random access memory (RRAM). A variable resistance of the data storage region may represent a data unit, such as a bit of data. Depending on a voltage applied between the top electrode 22 and the bottom electrode 12, the variable resistance may be switched between a high resistance state and a low resistance state. In some embodiments, the switching layer 16 is, but not limited to be, a high-k dielectric material having a dielectric constant greater than 3.9. In some embodiments, the material of the switching layer 16 may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like. In some embodiments, the material of the switching layer 16 may include, but is not limited to, semiconductive material such as amorphous silicon, germanium selenide, germanium telluride or the like.

The top electrode 22 is formed from a conductive material. Examples of the conductive material for the top electrode 22 may include, but are not limited to, doped semiconductive material such as polycrystalline silicon or the like, metal such as gold, tungsten, platinum, iridium, ruthenium or the like, metal nitride such as titanium nitride, tantalum nitride or the like.

In some embodiments, a capping layer 20 may be formed over the switching layer 16 prior to formation of the top electrode 22. In some embodiments, the material of the capping layer 20 may include, but is not limited to, metal such as titanium, tantalum, hafnium, aluminum or the like. In some embodiments, the metal of the capping layer 20 may extract ions such as oxygen from the switching layer 16, such that the capping layer 20 may include an ion reservoir region 18 with lower oxygen concentration than the switching layer 16. In some other embodiments, the material of the capping layer 20 may include, but is not limited to, a high k dielectric material having a dielectric constant greater than 3.9. For example, the material of the capping layer 20 may include metal oxide such as titanium oxide, tantalum oxide, hafnium oxide, aluminum oxide or the like. The oxygen concentration of the metal oxide of the capping layer 20 is lower than that of the switching layer 16, and thus can form an ion reservoir region 18 in the capping layer 20.

A diffusion barrier layer 14 is formed between the bottom electrode 12 and the switching layer 16 to form a semiconductor device 1 of some embodiments of the present disclosure. In some embodiments, the diffusion barrier layer 14 abuts the switching layer 16, e.g., the diffusion barrier layer 14 may be in contact with the switching layer 16. In some embodiments, the diffusion barrier layer 14 abuts the bottom electrode 12, e.g., the diffusion barrier layer 14 may be in contact with the bottom electrode 12. The diffusion barrier layer 14 may include an inert material or is less reactive to the ions than the bottom electrode 12, such that the diffusion barrier layer 14 may obstruct diffusion of ions between the switching layer 16 and the bottom electrode 12. In some embodiments, the thickness of the diffusion barrier layer 14 may be in a range between about 50 angstroms and about 300 angstroms, but is not limited thereto.

In some embodiments, the semiconductor device 1 may include a RRAM, which employs oxygen vacancies in the switching layer 16 to form conductive filaments. The ion reservoir region 18 may be configured as an oxygen reservoir region to store oxygen ions and facilitates resistance changes within the switching layer 16. In some embodiments, the diffusion barrier layer 14 may help to prevent oxygen ions from diffusion from the switching layer 16 into the diffusion barrier layer 14 and the bottom electrode 12, and may help to prevent oxygen ions from diffusion from the diffusion barrier layer 14 and the bottom electrode 12 into the switching layer 16. In some embodiments, the diffusion barrier layer 14 may help to retard diffusion of oxygen ions from the switching layer 16 into the diffusion barrier layer 14 and the bottom electrode 12, and may help to retard diffusion of oxygen ions from the diffusion barrier layer 14 and the bottom electrode 12 into the switching layer 16.

When the semiconductor device 1 is a resistive random access memory (RRAM), the diffusion barrier layer 14 is configured as an oxygen diffusion barrier layer. Examples of the material for the oxygen diffusion barrier layer may include metal, metal oxide, metal nitride, silicate, silicide, or a combination thereof. By way of examples, the metal for the oxygen diffusion barrier layer may include iridium (Ir), ruthenium (Ru), platinum (Pt) or a combination thereof. The metal oxide for the oxygen diffusion barrier layer may include iridium oxide, ruthenium oxide or a combination thereof. The metal nitride for the oxygen diffusion barrier layer may include ruthenium-titanium nitride. The silicate for the oxygen diffusion barrier layer may include tantalum-silicon-nitride. The silicide for the oxygen diffusion barrier layer may include tungsten silicide.

In some other embodiments, the semiconductor device 1 may include a conductive bridge random access memory (CBRAM), which employs active metal ions in the switching layer 16 to form conductive filaments. The ion reservoir region 18 may be configured as an active metal reservoir region to store active metal ions such as copper ions, silver ions, aluminum ions or the like. In some embodiments, the material of the capping layer 20 having the ion reservoir region 18 may include, but is not limited to, metal such as copper, silver, aluminum, nickel or the like, metal compound such as copper tantalum or the like, or metal compound such as copper tellurium or the like. The material of the switching layer 16 may include, but is not limited to, compounds such as ion compound, covalent compound, oxide compound, semiconductive material or the like. By way of example, the ion compound may include germanium sulfide (GeS), germanium antimony tellurium (GeSbTe) or the like. The covalent compound may include arsenic sulfide (AaS) or the like. The oxide compound may include tantalum oxide, silicon oxide, aluminum oxide, titanium oxide or the like. The semiconductive material may include amorphous silicon or the like.

In some embodiments, the diffusion barrier layer 14 may help to prevent metal ions such as copper ions, silver ions, aluminum ions or the like from diffusion from the switching layer 16 into the diffusion barrier layer 14 and the bottom electrode 12, and may help to prevent active metal ions from diffusion from the diffusion barrier layer 14 and the bottom electrode 12 into the switching layer 16. In some embodiments, the diffusion barrier layer 14 may help to retard diffusion of active metal ions from the switching layer 16 into the diffusion barrier layer 14 and the bottom electrode 12, and may help to retard diffusion of active metal ions from the diffusion barrier layer 14 and the bottom electrode 12 into the switching layer 16.

When the semiconductor device 1 is a CBRAM, the diffusion barrier layer 14 is configured as an active metal diffusion barrier layer. Examples of the material for the active metal diffusion barrier layer may include metal, metal nitride, metal alloy, or a combination thereof. By way of examples, the metal for the active metal diffusion barrier layer may include palladium (Pd), tantalum (Ta), hafnium (Hf), zirconium (Zr), niobium (Nb), cobalt (Co), ruthenium (Ru) or a combination thereof. The metal nitride for the active metal diffusion barrier layer may include titanium nitride, tantalum nitride, tungsten nitride, tantalum tungsten nitride, ruthenium titanium nitride, ruthenium tantalum nitride, tantalum silicon nitride, tantalum germanium oxynitride (Ta—Ge—(O)N) or a combination thereof. The metal alloy for the active metal diffusion barrier layer may include nickel chromium alloy.

After the semiconductor device 1 is fabricated, an initialization operation is performed. In case the semiconductor device 1 is an RRAM, the initialization operation can be performed to break the bonding between metal and oxygen, thereby forming oxygen vacancies, i.e. conductive filaments in the switching layer 16. In case the semiconductor device 1 is a CBRAM, the initialization operation can be performed to emigrate active metal ions from the ion reservoir region 18 to the switching layer 16, thereby forming metal-bridges, i.e. conductive filaments in the switching layer 16. The semiconductor device 1 may also undergo a baking operation to verity data retention at a high temperature. After the initialization operation, the semiconductor device 1 can be operated in a reset state or in a set state.

Figure 4A:
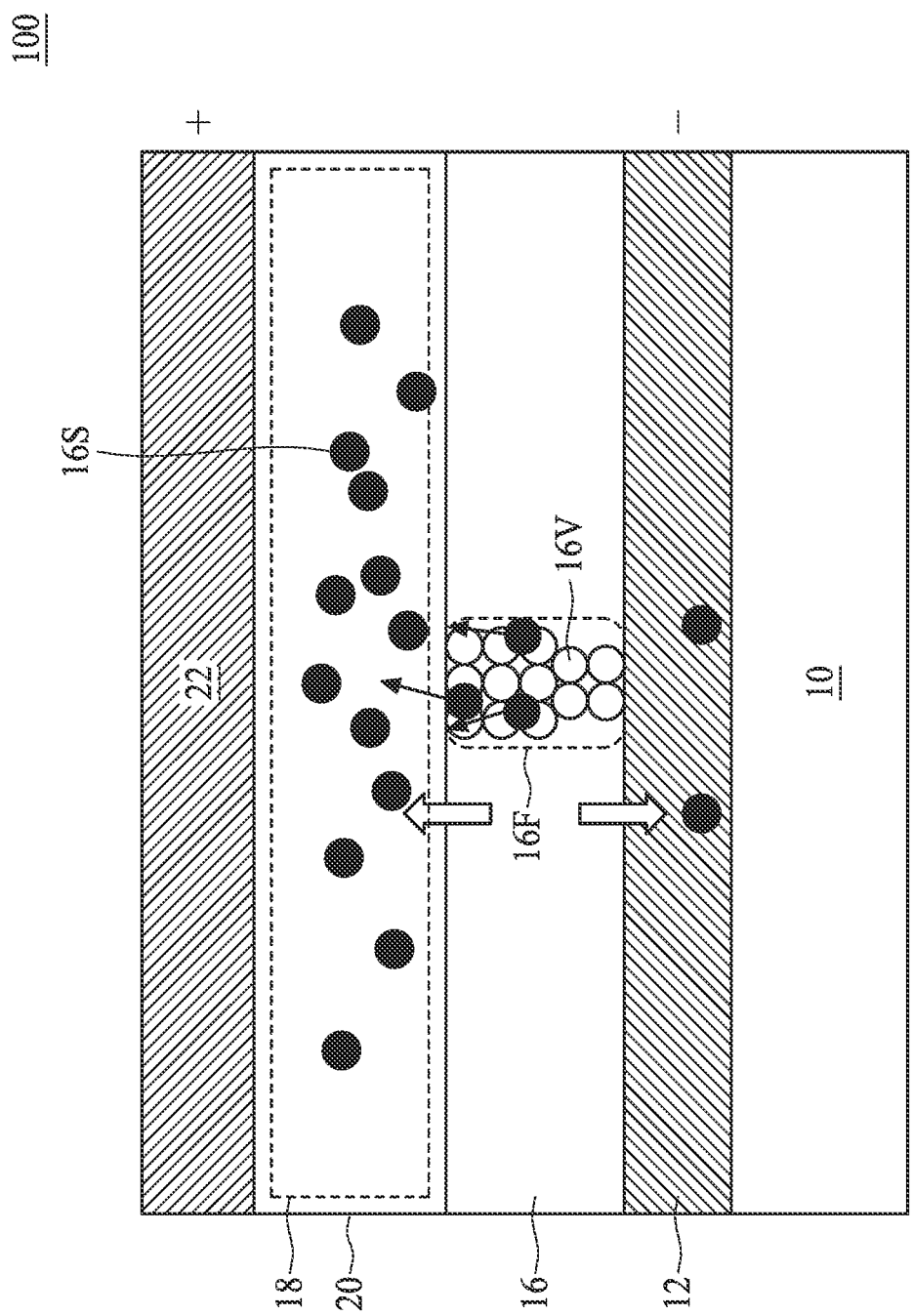
FIG. 4A, FIG. 4B and FIG. 4C are schematic diagrams illustrating different operational states of a semiconductor device 100, in accordance with some comparative embodiments of the present disclosure.
Figure 4B:
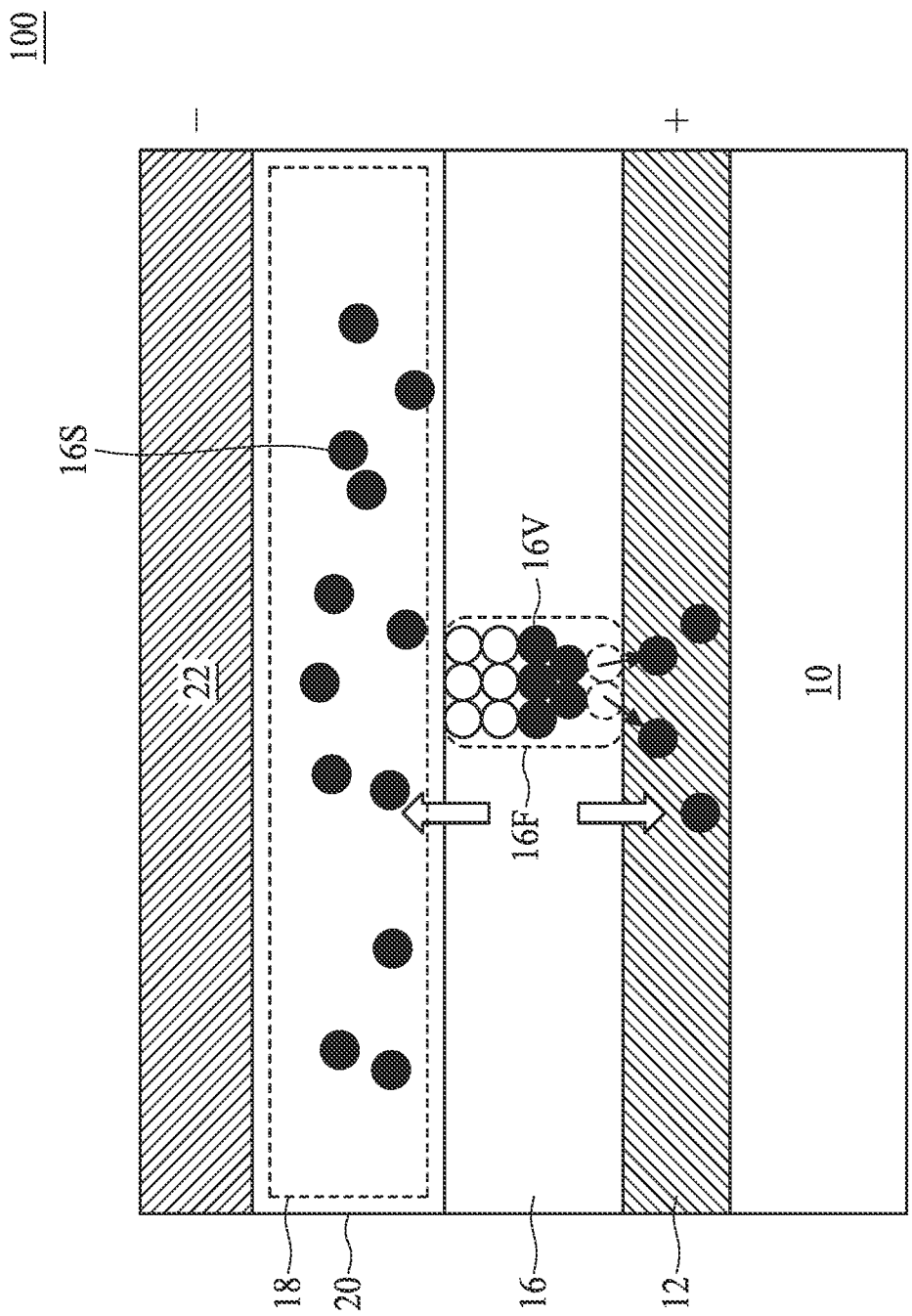
Figure 4C:
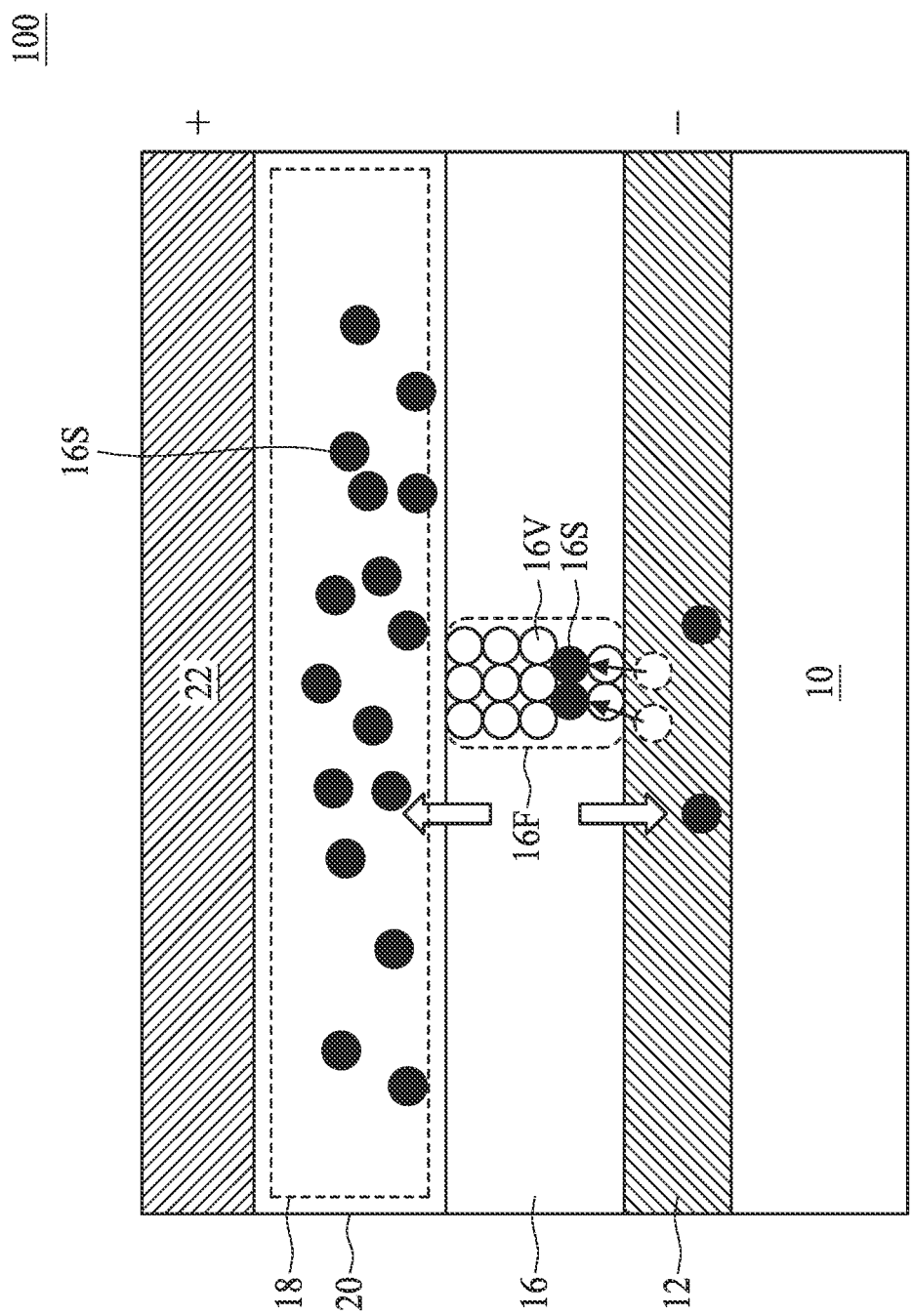

FIG. 4A, FIG. 4B and FIG. 4C are schematic diagrams illustrating different operational states of a semiconductor device 100, in accordance with some comparative embodiments of the present disclosure. As shown in FIG. 4A, an initialization operation is performed by applying a forming voltage across the top electrode 22 and the bottom electrode 12 to initially form the conductive filaments 16F. In some embodiments, the top electrode 22 is supplied with a positive voltage, and the bottom electrode 12 is supplied with a negative voltage. In case the semiconductor device 1 is an RRAM, the forming voltage is applied to break the bonding between metal and oxygen, thereby forming oxygen vacancies, i.e. conductive filaments in the switching layer 16. The localized vacancies 16V tend to align to form the conductive filaments 16F which may extend through the switching layer 16 and may be relatively permanent. In case the semiconductor device 1 is a CBRAM, the forming voltage is applied to make active metal ions emigrate from the ion reservoir region 18 to the switching layer 16, thereby forming metal-bridges, i.e. conductive filaments in the switching layer 16. During the initialization operation of a CBRAM, ions 16S may also diffuse into the bottom electrode 12.

As shown in FIG. 4B, a reset operation is performed by applying a reset voltage across the top electrode 22 and the bottom electrode 12 to switch the switching layer 16 from lower resistance state (LRS) to high resistance state (HRS). In some embodiments, the top electrode 22 is supplied with a negative voltage, and the bottom electrode 12 is supplied with a positive voltage. The ions 16S will move back from the ion reservoir region 18 to the switching layer 16, thereby filling vacancies 16V and breaking the conductive filaments 16F to increase resistivity. During the reset operation, some of the ions 16S may be diffused from the switching layer 16 to the bottom electrode 12, such that the conductive filaments 16F cannot be closed completely. In some embodiments, some of the ions 16S may also be diffused from the switching layer 16 to the bottom electrode 12 during a baking operation, thereby adversely affecting closing of the conductive filaments 16F.

As shown in FIG. 4C, a set operation is performed by applying a set voltage across the top electrode 22 and the bottom electrode 12 to switch the switching layer 16 from high resistance state (HRS) to lower resistance state (LRS). In some embodiments, the top electrode 22 is supplied with a positive voltage, and the bottom electrode 12 is supplied with a negative voltage. The ions 16S in the switching layer 16 will move to the ion reservoir region 18, thereby leaving vacancies 16V and re-forming conductive filaments 16F to lower resistivity. During the set operation, some of the ions 16S may be diffused from the bottom electrode 12 to the switching layer 16, such that the conductive filaments 16F cannot be open completely. In some embodiments, some of the ions 16S may also be diffused from the bottom electrode 12 to the switching layer 16 during a baking operation, thereby adversely affect opening of the conductive filaments 16F.

Figure 5A:
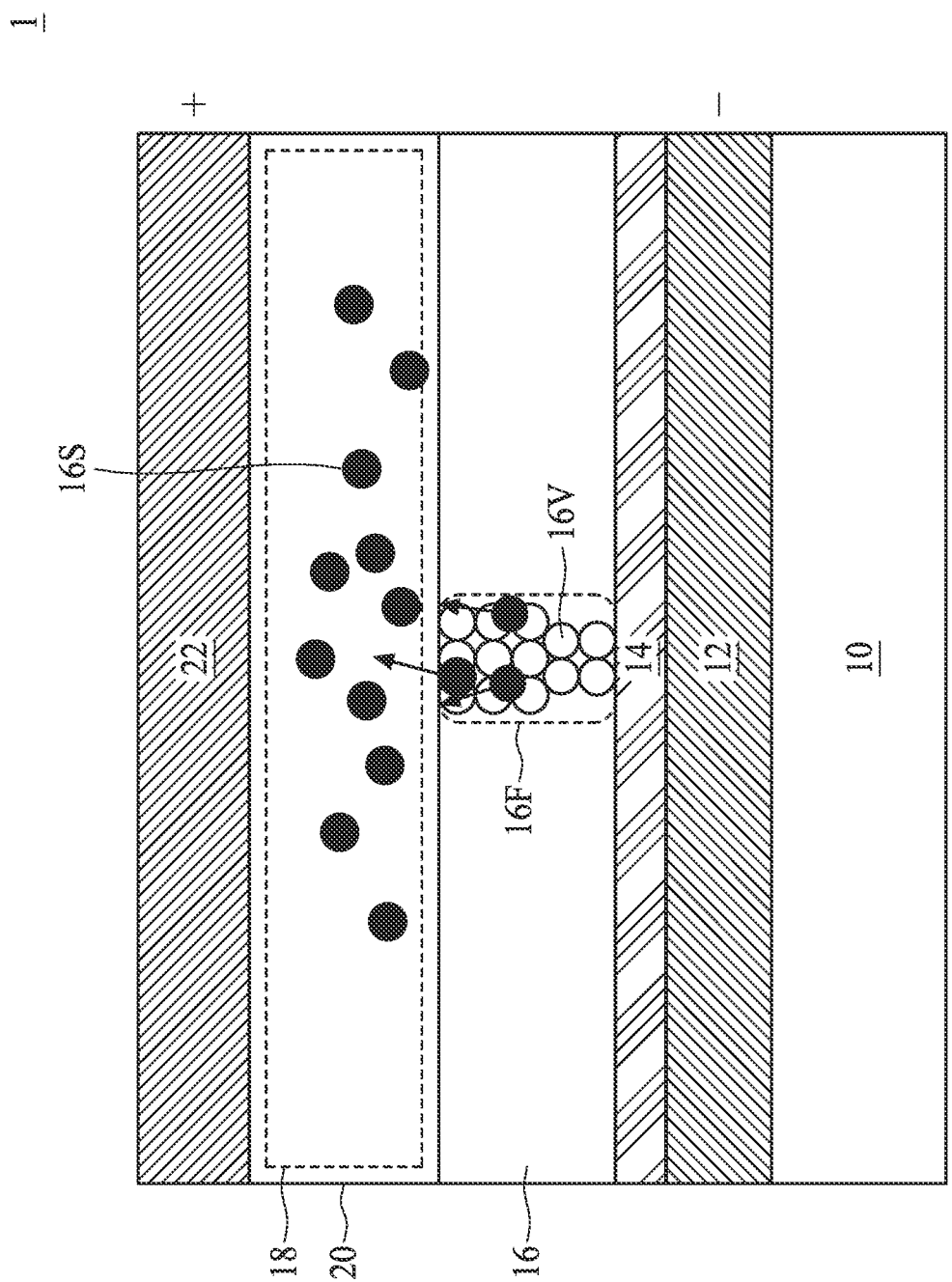
FIG. 5A, FIG. 5B and FIG. 5C are schematic diagrams illustrating different operational states of a semiconductor device 1, in accordance with some embodiments of the present disclosure.
Figure 5B:
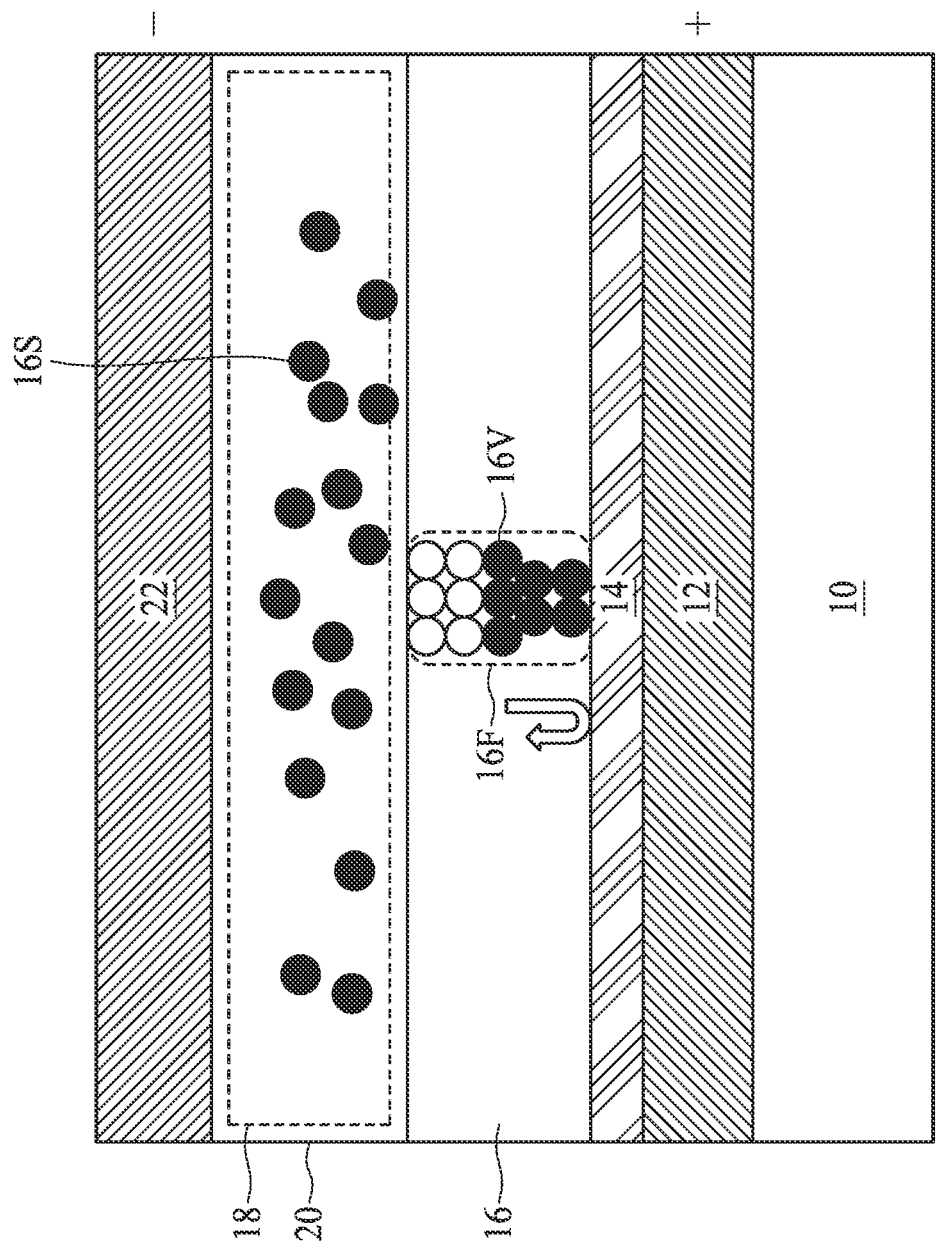
Figure 5C:
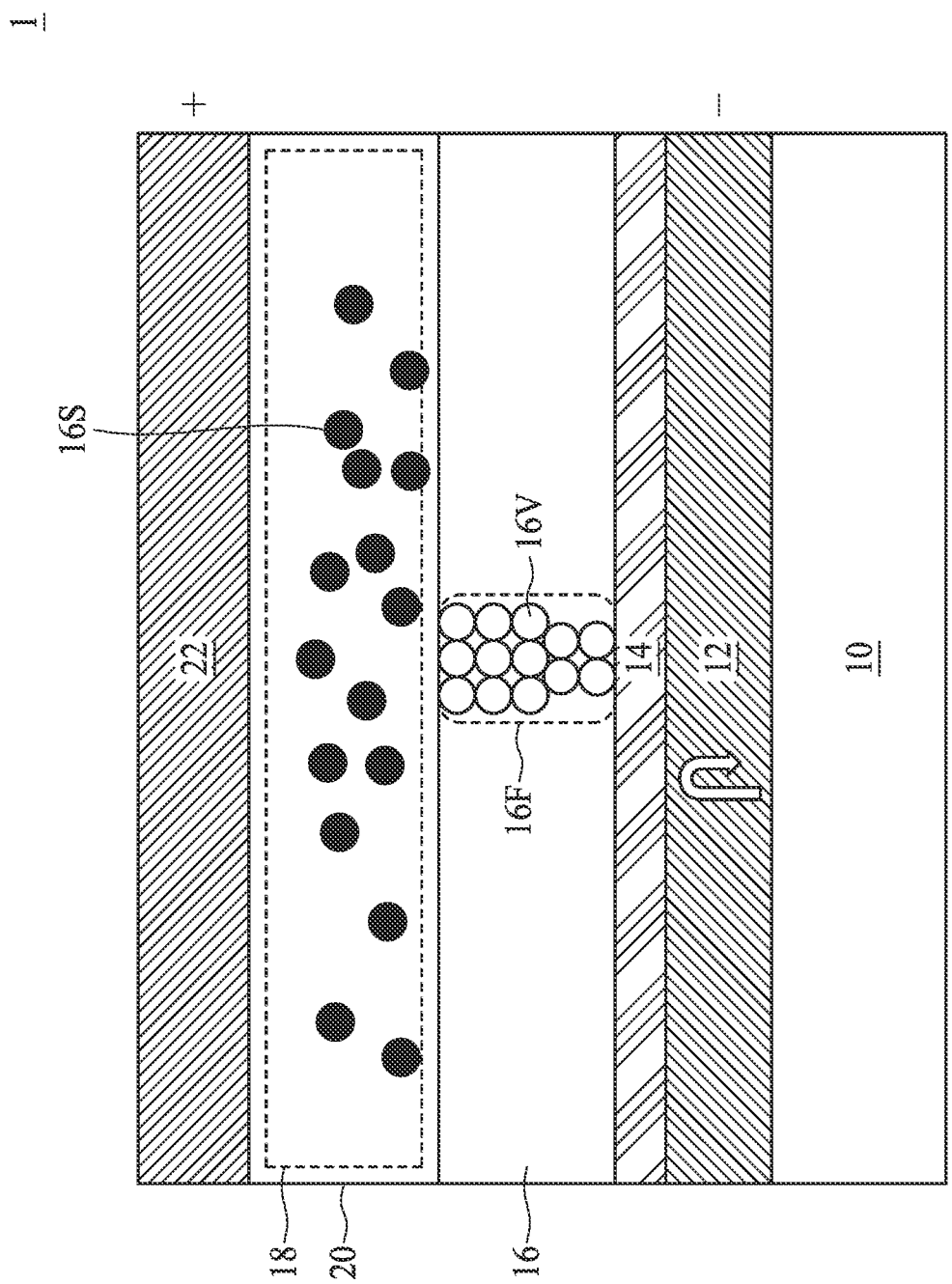

FIG. 5A, FIG. 5B and FIG. 5C are schematic diagrams illustrating different operational states of a semiconductor device 1, in accordance with some embodiments of the present disclosure. As shown in FIG. 5A, after the semiconductor device 1 is fabricated, an initialization operation is performed by applying a forming voltage across the top electrode 22 and the bottom electrode 12 to initially form the conductive filaments 16F. In some embodiments, the top electrode 22 is supplied with a positive voltage, and the bottom electrode 12 is supplied with a negative voltage. The forming voltage is applied to break the bonding between the atoms 16S and other element of the switching layer 16, thereby forming vacancies 16V in the switching layer 16, and driving ions 16S to the ion reservoir region 18. The localized vacancies 16V tend to align to form the conductive filaments 16F which may extend through the switching layer 16 and may be relatively permanent. During the initialization operation, the diffusion barrier layer 14, which is inert or less reactive to ions 16S than the bottom electrode 12 can help to prevent or retard diffusion of ions 16S from the switching layer 16 into the diffusion barrier layer 14 and the bottom electrode 12.

As shown in FIG. 5B, a reset operation is performed by applying a reset voltage across the top electrode 22 and the bottom electrode 12 to switch the switching layer 16 from LRS to HRS. In some embodiments, the top electrode 22 is supplied with a negative voltage, and the bottom electrode 12 is supplied with a positive voltage. The ions 16S will move back from the ion reservoir region 18 to the switching layer 16, thereby filling vacancies 16V and breaking the conductive filaments 16F to increase resistivity. During the reset operation, the diffusion barrier layer 14 can help to prevent or retard diffusion of ions 16S from the switching layer 16 into the diffusion barrier layer 14 and the bottom electrode 12. Thus, the diffusion barrier layer 14 can help to retain the ions 16S in the switching layer 16, such that the conductive filaments 16F can be closed more robustly in the reset state. During a baking operation, the diffusion barrier layer 14 can also help to prevent or retard diffusion of ions 16S from the switching layer 16 into the diffusion barrier layer 14 and the bottom electrode 12.

As shown in FIG. 5C, a set operation is performed by applying a set voltage across the top electrode 22 and the bottom electrode 12 to switch the switching layer 16 from HRS to LRS. In some embodiments, the top electrode 22 is supplied with a positive voltage, and the bottom electrode 12 is supplied with a negative voltage. The ions 16S in the switching layer 16 will move to the ion reservoir region 18, thereby leaving vacancies 16V and re-forming conductive filaments 16F to lower resistivity. During the set operation, the diffusion barrier layer 14 can help to prevent or retard diffusion of ions 16S from the bottom electrode 12 and the diffusion barrier layer 14 into the switching layer 16. Thus, the diffusion barrier layer 14 can help to block the ions 16S from diffusing into the switching layer 16 from the bottom electrode 12, such that the conductive filaments 16F can be open more robustly in the set state. During a baking operation, the diffusion barrier layer 14 can also help to prevent or retard diffusion of ions 16S from the bottom electrode 12 and the diffusion barrier layer 14 into the switching layer 16.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6A:
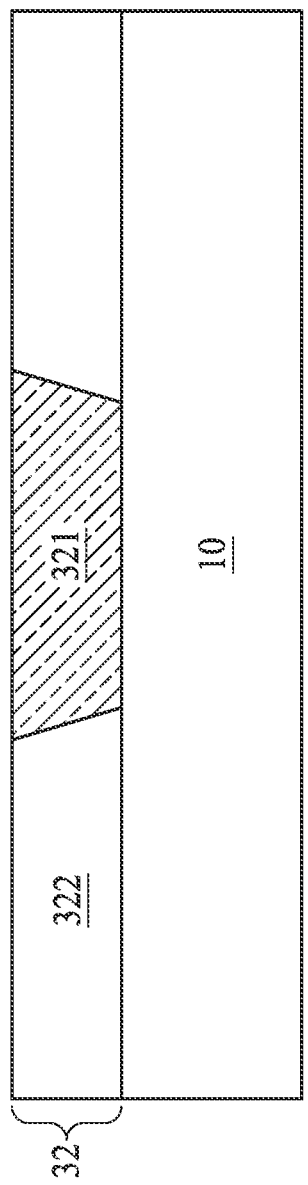

FIG. 6A, FIG. 6B, FIG. 6C, FIG. 6D, FIG. 6E, FIG. 6F and FIG. 6G are schematic views at one of various operations of manufacturing a semiconductor device according to one or more embodiments of the present disclosure. As shown in FIG. 6A, a substrate 10 is received. In some embodiments, a bottom interconnect structure 32 may be formed over the substrate 10. In some embodiments, the bottom interconnect structure 32 includes a bottom metallization layer 321, and a bottom inter-layer dielectric (ILD) layer 322 laterally surrounding the bottom metallization layer 321. In some embodiments, the bottom metallization layer 321 may be one layer of the back-end-of-the line (BEOL). In some embodiments, the material of the bottom metallization layer 321 may include metal or alloy such as copper, tungsten, alloy thereof or the like. The material of the bottom ILD layer 322 may include dielectric material such as low-k dielectric material with a dielectric constant less than 2.0 or the like, but is not limited thereto.

Figure 6B:
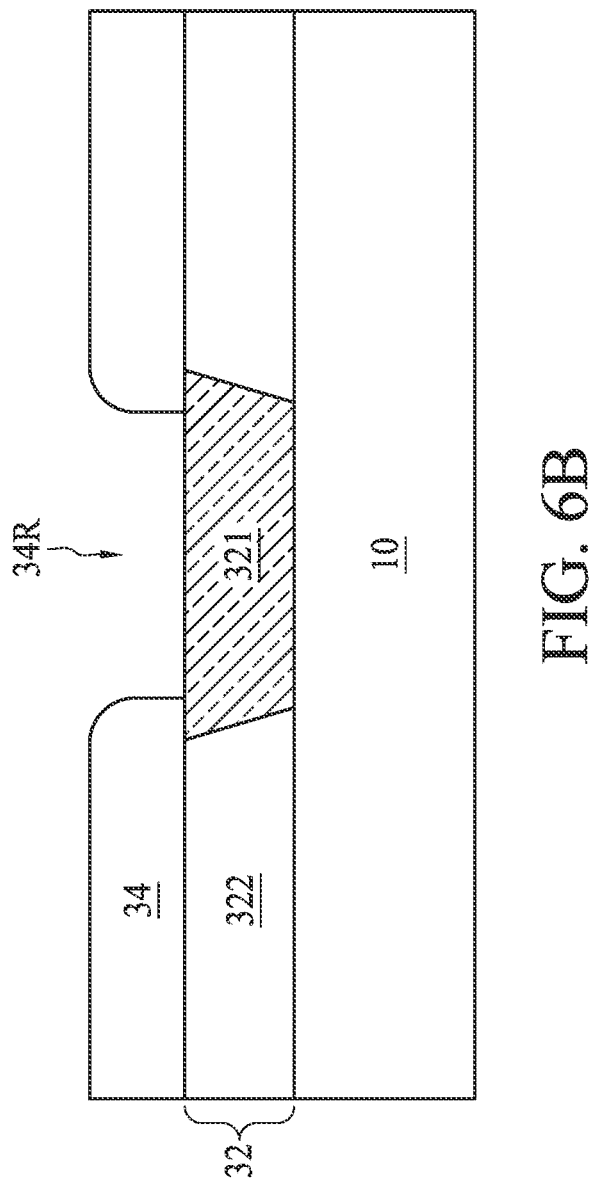

As shown in FIG. 6B, a dielectric layer 34 is formed over the substrate 10. In some embodiments, the dielectric layer 34 is formed over the bottom interconnect structure 32 and includes an opening 34R exposing a portion of the bottom metallization layer 321. In some embodiments, the material of the dielectric layer 34 may include dielectric material such as silicon oxide, silicon nitride, silicon oxynitride or the like.

Figure 6C:
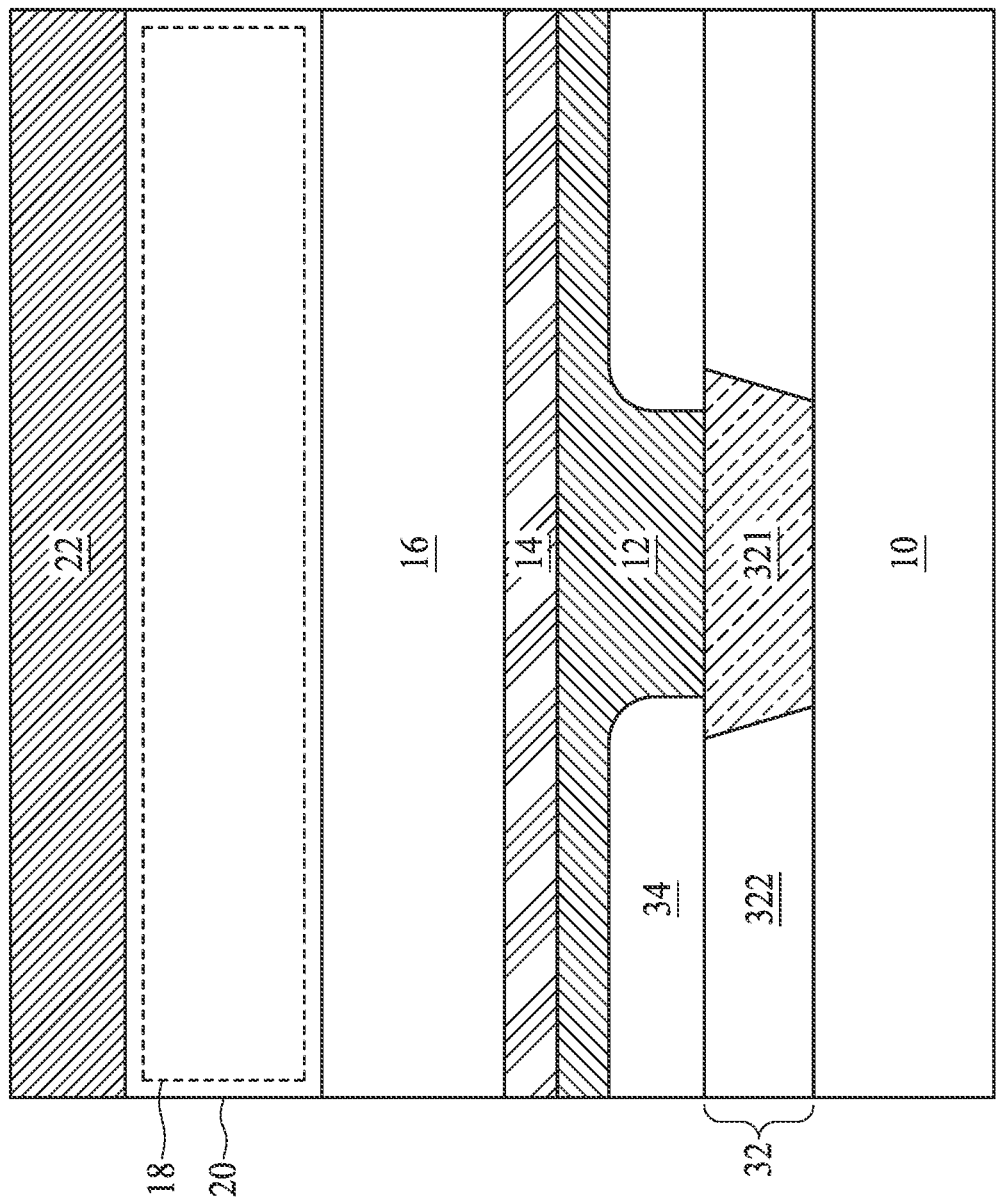

As shown in FIG. 6C, a bottom electrode 12 is formed over the dielectric layer 34, and electrically connected to the exposed bottom metallization layer 321. In some embodiments, the bottom electrode 12 may be formed to have a substantially planar upper surface. Subsequently, a diffusion barrier layer 14, a switching layer 16 and a top electrode 22 may be formed over the bottom electrode 12. In some embodiments, an ion reservoir region 18 may be formed over the switching layer 16 prior to formation of the top electrode 22. In some embodiments, a capping layer 20 may be formed over the ion reservoir region 18 prior to formation of the top electrode 22. The diffusion barrier layer 14, the switching layer 16, the ion reservoir region 18, the capping layer 20 and the top electrode 22 may have substantially planar upper surface as the bottom electrode 12. The materials for the the bottom electrode 12, the diffusion barrier layer 14, the switching layer 16, the capping layer 20 and the top electrode 22 may be the same as the aforementioned embodiments, and are not redundantly described.

Figure 6D:
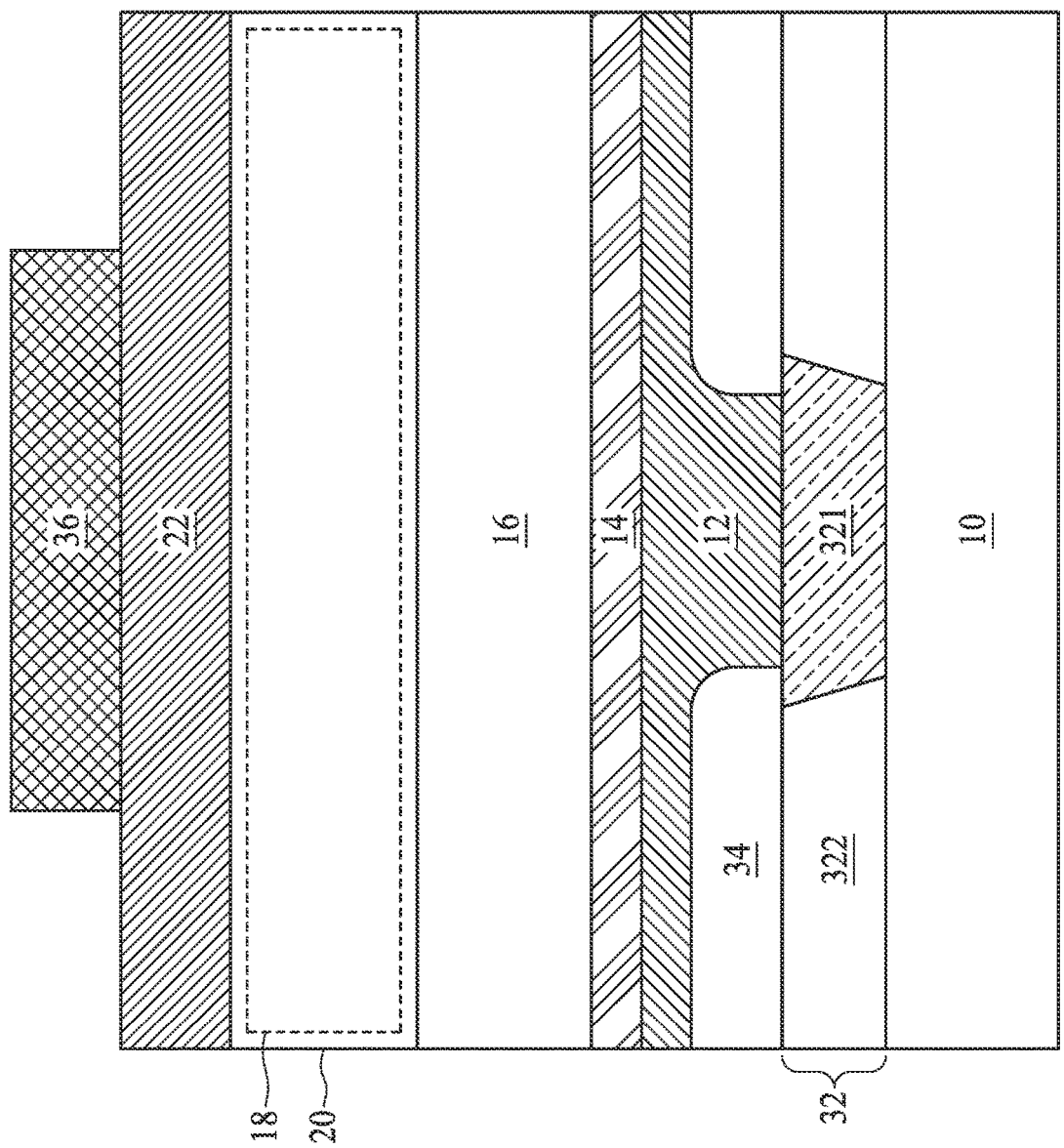

As shown in FIG. 6D, a mask layer 36 is formed over the top electrode 22. The mask layer 36 covers a portion of the top electrode 22, and exposes the rest of the top electrode 22. In some embodiments, the mask layer 36 may include a photoresist layer, but is not limited thereto.

As shown in FIG. 6E, the top electrode 22, the capping layer 20, the ion reservoir region 18, the switching layer 16, the diffusion barrier layer 14 and the bottom electrode 12 are patterned. In some embodiments, the mask layer 36 is used as an etching mask to pattern the top electrode 22, the capping layer 20, the ion reservoir region 18, the switching layer 16, the diffusion barrier layer 14 and the bottom electrode 12. In some embodiments, the top electrode 22, the capping layer 20, the ion reservoir region 18, the switching layer 16, the diffusion barrier layer 14 and the bottom electrode 12 are patterned by etching. In some embodiments, the etching may include dry etching, wet etching or a combination thereof. The top electrode 22, the capping layer 20, the ion reservoir region 18, the switching layer 16, the diffusion barrier layer 14 and the bottom electrode 12 may be patterned by one etching operation, or multiple etching operations. In some embodiments, the width of the top electrode 22, the capping layer 20 and the ion reservoir region 18 may be smaller than that of the switching layer 16, the diffusion barrier layer 14 and the bottom electrode 12 after etching, and a portion of the upper surface of the switching layer 16 may be exposed. The mask layer 36 may be removed after the top electrode 22, the capping layer 20, the ion reservoir region 18, the switching layer 16, the diffusion barrier layer 14 and the bottom electrode 12 are patterned.

Figure 6F:
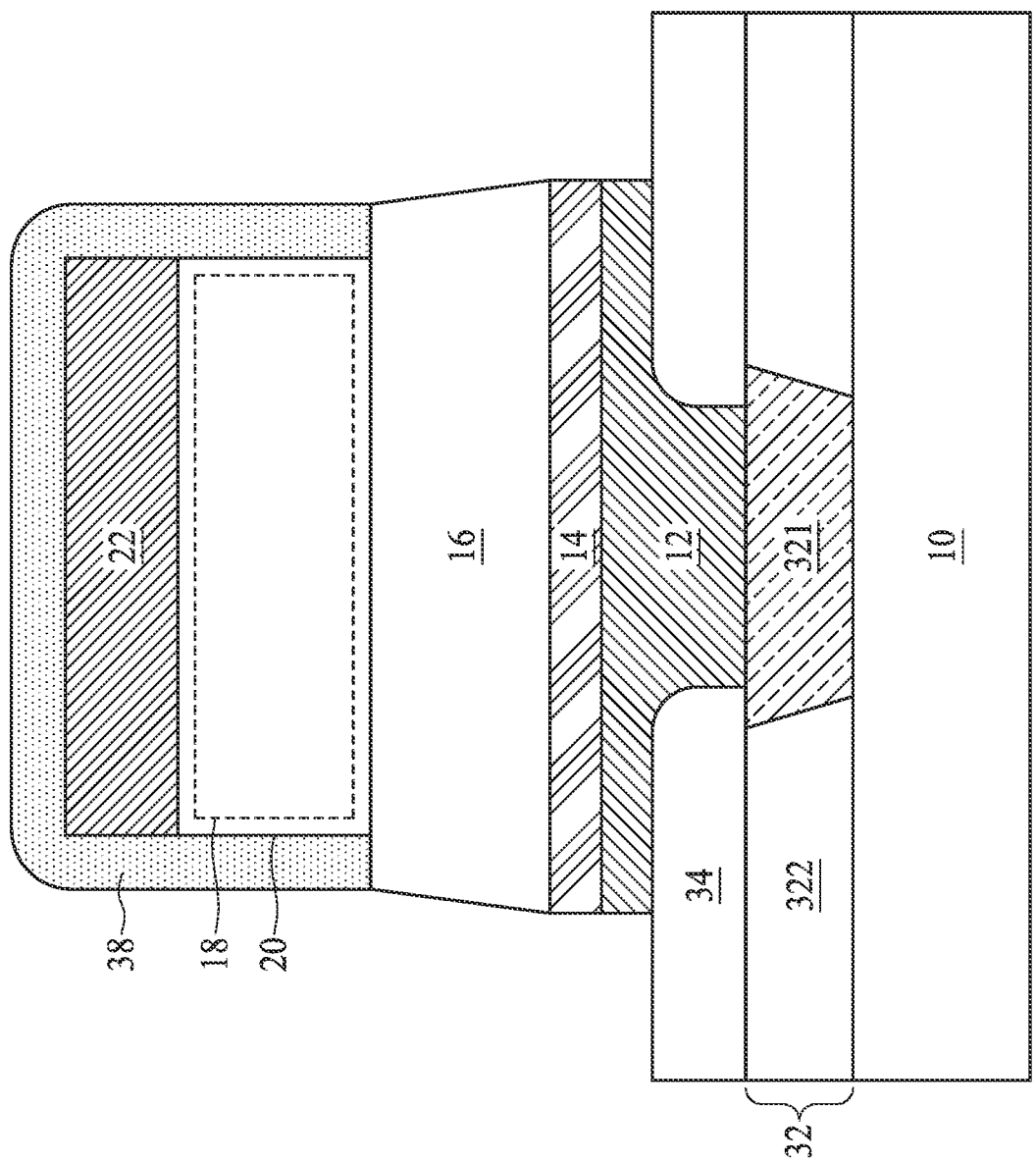

As shown in FIG. 6F, a passivation layer 38 can be optionally formed. In some embodiments, the passivation layer 38 is insulative. In some embodiments, the passivation layer 38 covers the upper surface of the top electrode 22. In some embodiments, the passivation layer 38 covers edges of the top electrode 22, the capping layer 20 and the ion reservoir region 18. In some embodiments, the passivation layer 38 further covers a portion of the switching layer 16. In some embodiments, the material of the passivation layer 38 includes dielectric material such as silicon oxide, silicon nitride, silicon oxynitride or the like, but is not limited thereto.

Figure 6G:
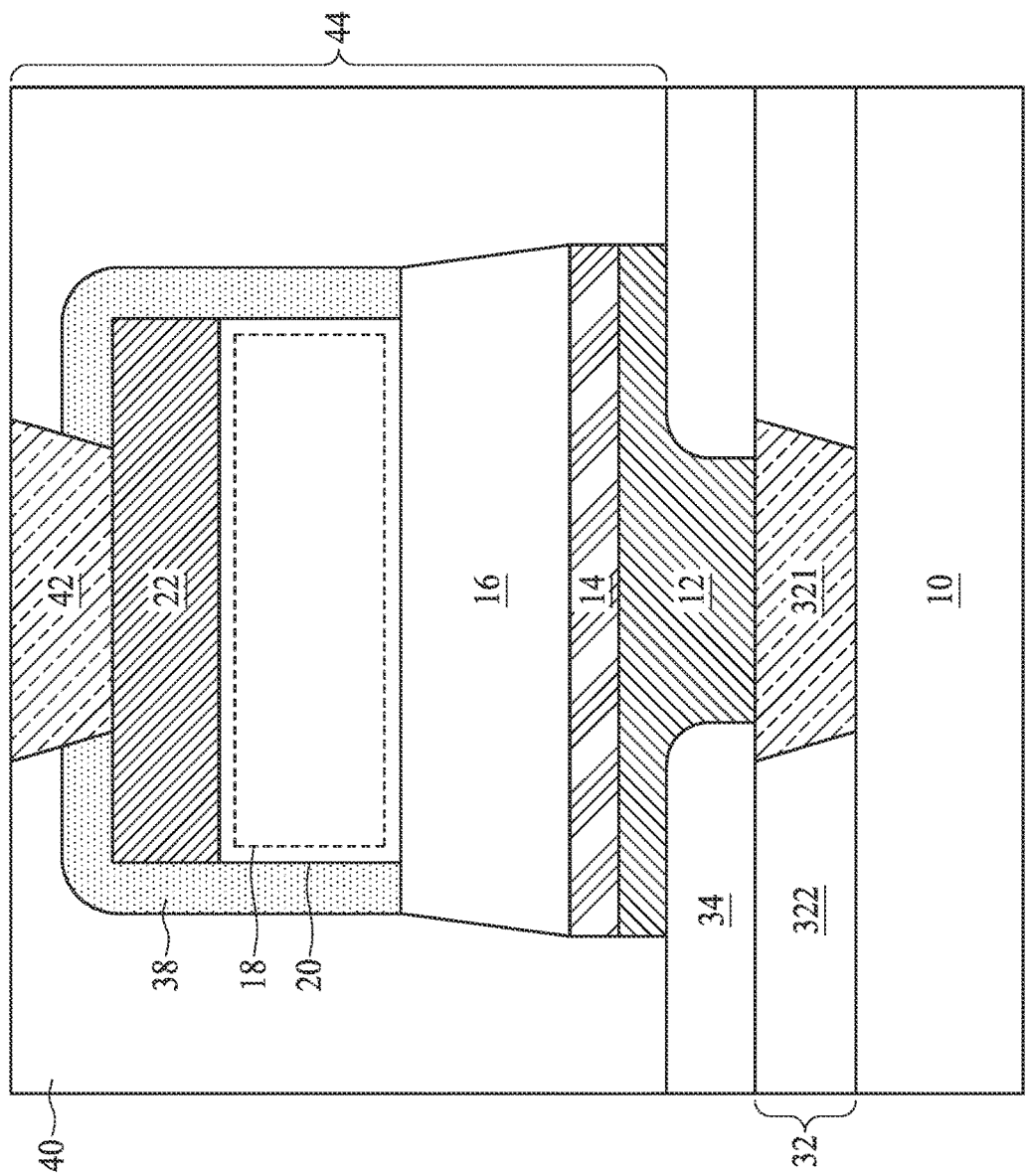

As shown in FIG. 6G, a top inter-layer dielectric (ILD) layer 40 is formed over the substrate 10, covering the passivation layer 38. In some embodiments, the material of the top ILD layer 322 may include dielectric material such as low-k dielectric material with a dielectric constant less than 2.0 or the like, but is not limited thereto. The top ILD layer 40 and the passivation layer 38 may be patterned by, e.g., photolithography and etching technique, to expose a portion of the top electrode 22. In some embodiments, a top metallization layer 42 is formed, and electrically connected to the top electrode 22 to form a semiconductor device 2. In some embodiments, the material of the top metallization layer 42 may include metal or alloy such as copper, tungsten, alloy thereof or the like. In some embodiments, the top metallization layer 42 and the top ILD layer 40 form a top interconnect structure 44. The semiconductor device 2 is a planar type semiconductor device, in which the top electrode 22, the capping layer 20, the ion reservoir region 18, the switching layer 16, the diffusion barrier layer 14 and the bottom electrode 12 may have planar upper surfaces.

In some embodiments, the semiconductor device 2 may be driven by a transistor device. By way of example, the bottom metallization layer 321 may be electrically connected to a drain electrode of a transistor device. The source electrode of the transistor device may be electrically connected to a source line, and the gate electrode of the transistor device may be electrically connected to a word line. The top metallization layer 42 may be electrically connected to a bit line.

In some embodiments, the semiconductor device 2 may be driven by a pair of transistor devices. By way of example, the bottom metallization layer 321 may be electrically connected to a common drain electrode of a transistor device. The source electrodes of the pair of transistor devices may be electrically connected to source lines, and the gate electrodes of the transistor device may be electrically connected to word lines. The top metallization layer 42 may be electrically connected to a bit line.

Figure 7:
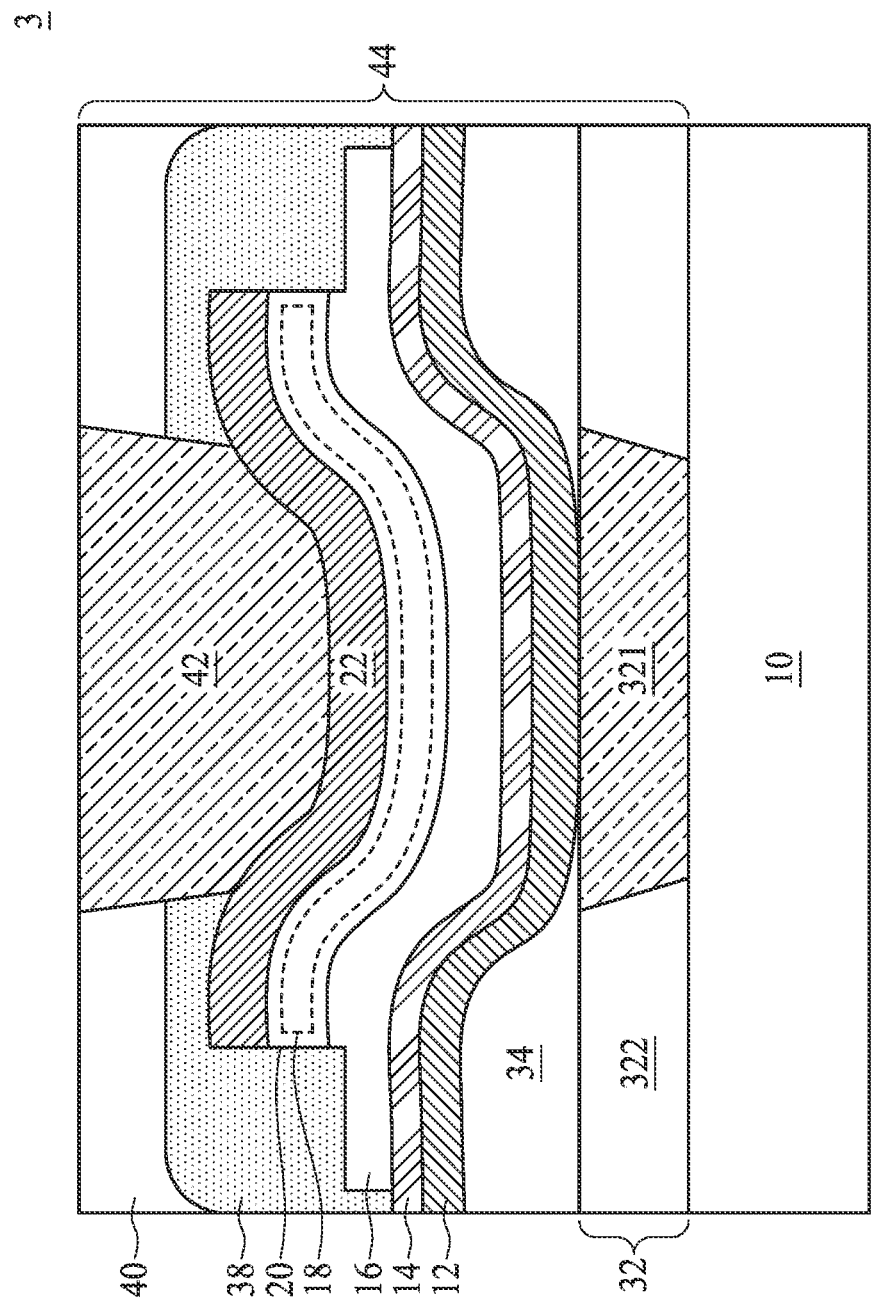
FIG. 7 is a schematic cross-sectional view of a semiconductor device according to some embodiments of the present disclosure.

FIG. 7 is a schematic cross-sectional view of a semiconductor device according to some embodiments of the present disclosure. As shown in FIG. 7, in contrast of the semiconductor device 2 of FIG. 6G, the semiconductor device 3 is a non-planar type semiconductor device, in which the upper surface of the bottom electrode 12 is recessed. In some embodiments, the upper surfaces of the top electrode 22, the capping layer 20, the switching layer 16 and the diffusion barrier layer 14 may be non-planar. For example, the upper surfaces of the top electrode 22, the capping layer 20, the switching layer 16 and the diffusion barrier layer 14 may be recessed.

Figure 8:
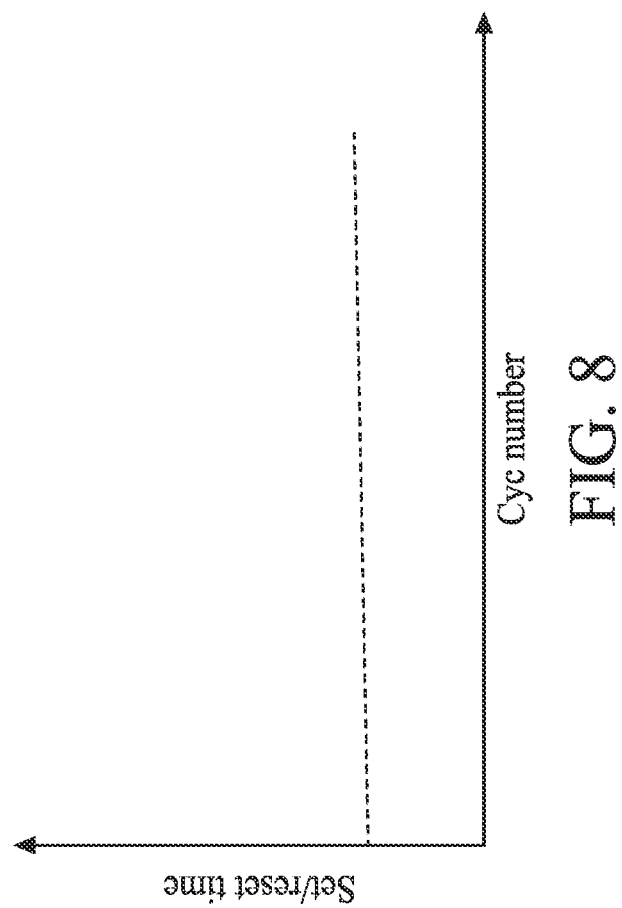
FIG. 8 is a plot illustrating a simulation result of set/reset time vs. cycle time relation in accordance with some embodiments of the present disclosure.

FIG. 8 is a plot illustrating a simulation result of set/reset time vs. cycle time relation in accordance with some embodiments of the present disclosure. As shown in FIG. 8, the degradation of set/reset time of the semiconductor device with the diffusion barrier layer is significantly addressed.

Figure 9:
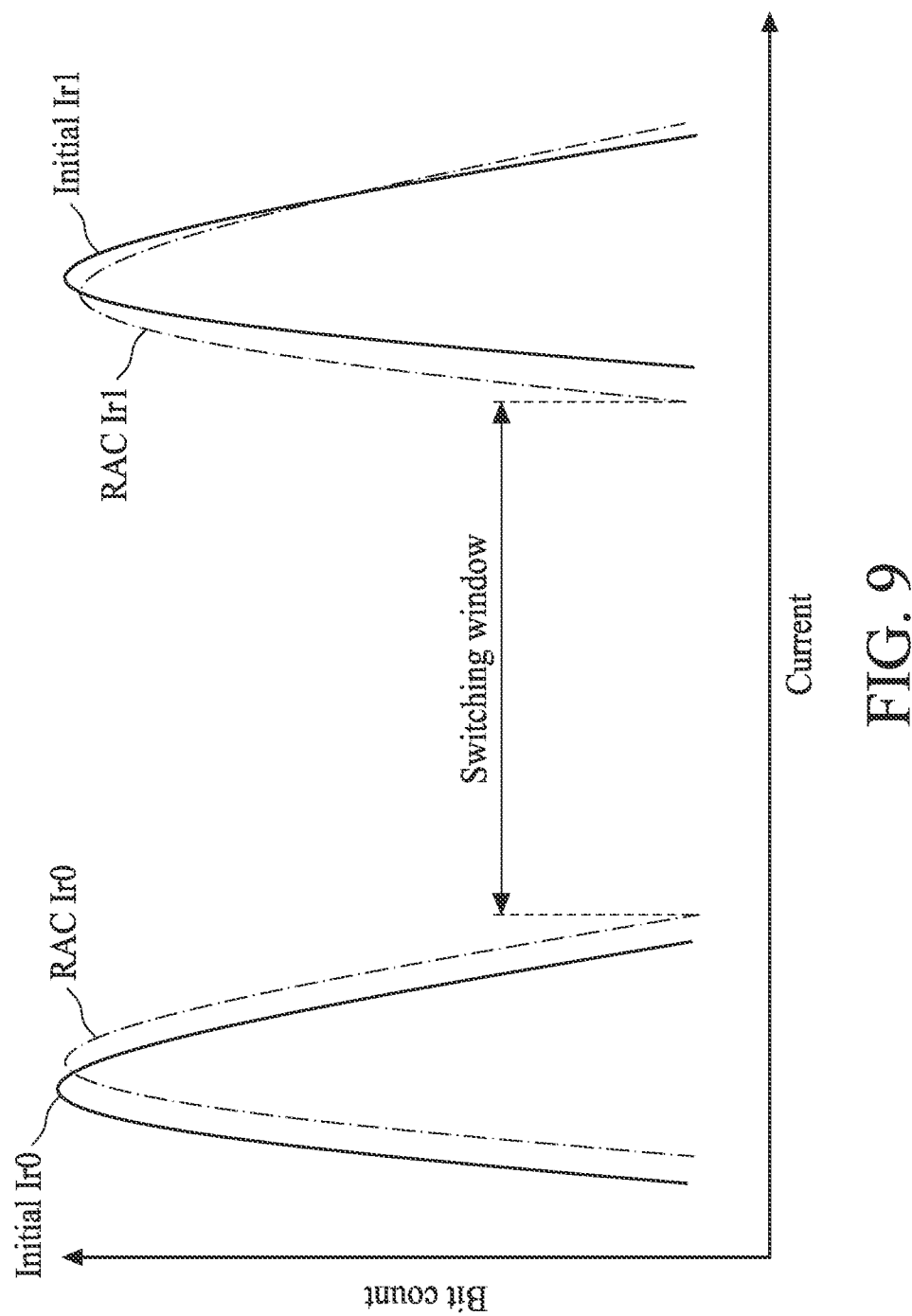
FIG. 9 is a plot illustrating a simulation result of bit count vs. current relation in accordance with some embodiments of the present disclosure.

FIG. 9 is a plot illustrating a simulation result of bit count vs. current relation in accordance with some embodiments of the present disclosure. As shown in FIG. 9, the switching window between the retention after cycling (RAC) Ir0 and Ir1 is close to the original switching window between the initial Ir0 and Ir1, thus the degradation of switching window of the semiconductor device with the diffusion barrier layer is significantly addressed.

Figure 10:
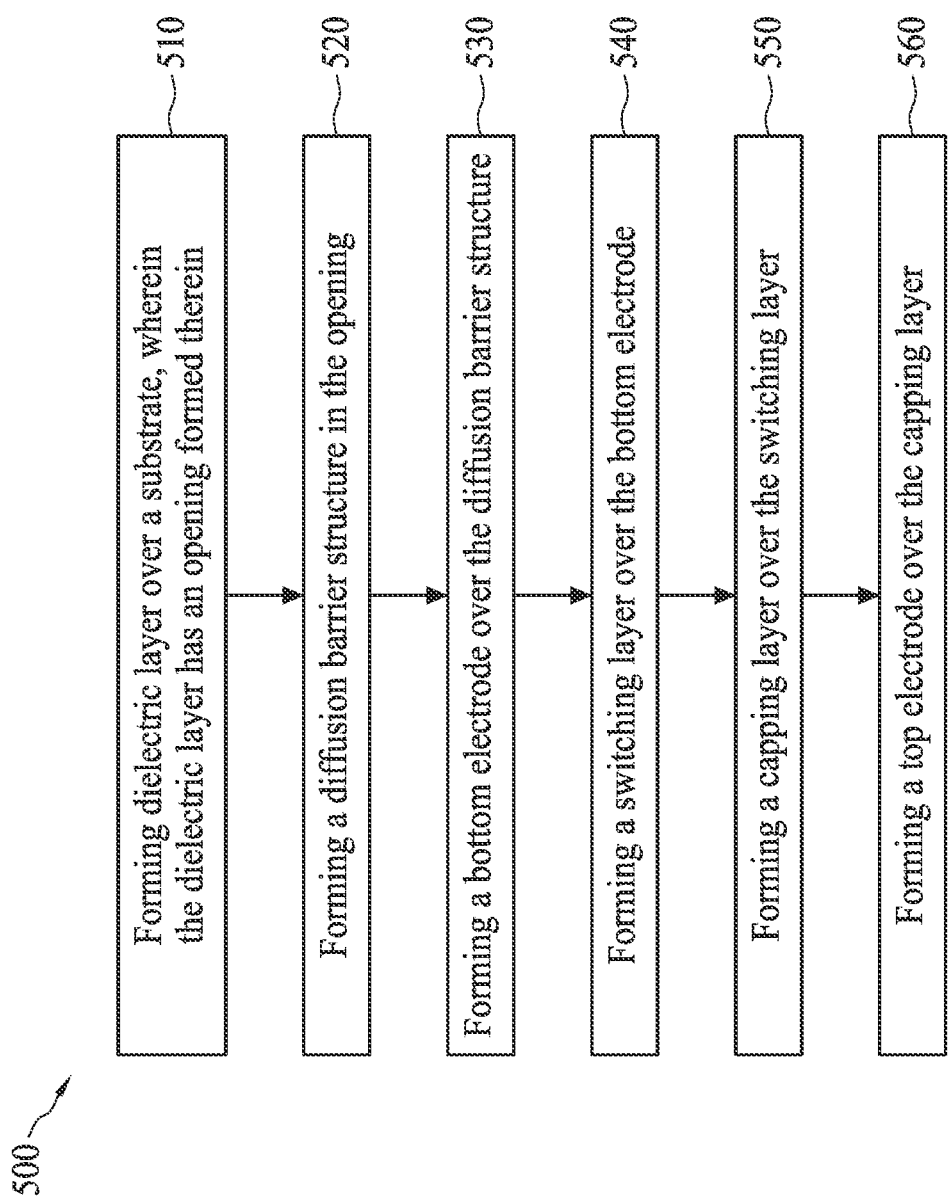
FIG. 10 a flow chart illustrating a method for manufacturing a semiconductor device according to various aspects of one or more embodiments of the present disclosure.

FIG. 10 is a flowchart illustrating a method for manufacturing a semiconductor device according to various aspects of one or more embodiments of the present disclosure. The method 500 begins with operation 510, in which a dielectric layer is formed over a substrate. The dielectric layer may have an opening formed therein. The method 500 proceeds with operation 520, in which a diffusion barrier structure is formed in the opening. The method 500 proceeds with operation 530, in which a bottom electrode is formed over the diffusion barrier structure. The method 500 continues with operation 540, in which a switching layer is formed over the bottom electrode. The method 500 continues with operation 550, in which a capping layer is formed over the switching layer. The method 500 continues with operation 560, in which a top electrode is formed over the capping layer.

The method 500 is merely an example to form a conductive bridge random access memory (CBRAM), and is not intended to limit the present disclosure beyond what is explicitly recited in the claims. Additional operations can be provided before, during, and after the method 500, and some operations described can be replaced, eliminated, or moved around for additional embodiments of the method.

Figure 11A:
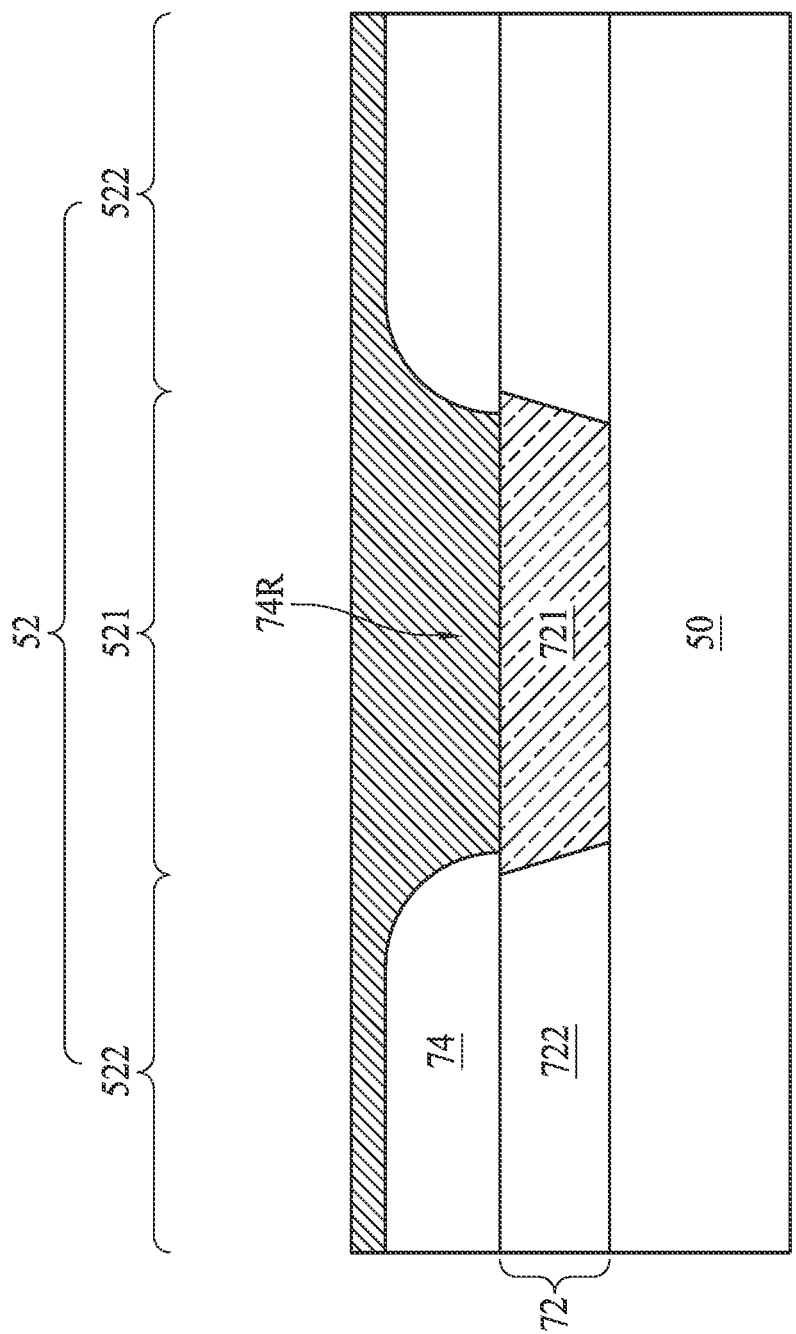
FIGS. 11A, FIG. 11B, FIG. 11C and FIG. 11D are schematic views of various operations of manufacturing a semiconductor device according to one or more embodiments of the present disclosure.

FIG. 11A, FIG. 11B, FIG. 11C and FIG. 11D are schematic views of various operations in the manufacturing of a semiconductor device according to one or more embodiments of the present disclosure. As shown in FIG. 11A, a substrate 50 is received. Materials of the substrate 50 can be similar to those mentioned above, and therefore such details are omitted. In some embodiments, semiconductor components such as transistor components, electronic components such as resistor components, capacitor components, or inductor components, and circuit layers may be formed in or over the substrate 50. In some embodiments, a bottom interconnect structure 72 may be formed over the substrate 50. In some embodiments, the bottom interconnect structure 72 includes a bottom metallization layer 721 and a bottom ILD layer 722 laterally surrounding the bottom metallization layer 721. In some embodiments, materials of the bottom metallization layer 721 and materials of the bottom ILD layer 722 may be similar to those mentioned above, and therefore such details are omitted for brevity.

As shown in FIG. 11A, a dielectric layer 74 is formed over the substrate 50 in operation 510. In some embodiments, the dielectric layer 74 is formed over the bottom interconnect structure 72 and includes an opening 74R exposing a portion of the bottom metallization layer 721. In some embodiments, material of the dielectric layer 74 can be similar to those mentioned above, and therefore such details are omitted for brevity.

As shown in FIG. 11A, a diffusion barrier structure 52 is formed over the substrate 50. The diffusion barrier structure 52 can be formed in the opening 74R in and over the dielectric layer 74 in operation 520. Further, the diffusion barrier structure 52 is electrically connected to the exposed bottom metallization layer 721. As shown in FIG. 11A, the diffusion barrier structure 52 is in contact with the bottom metallization layer 721. In some embodiments, the diffusion barrier structure 52 is conformally formed in the opening 74R and includes a consistent thickness (shown in FIG. 14). In other embodiments, the diffusion barrier structure 52 may be formed to fill the opening 74R and thus may have a substantially planar upper surface as shown in FIG. 11A. In such embodiments, the diffusion barrier structure 52 may have a first portion 521 mainly in the opening 74R and a second portion 522 surrounding the first portion 521. A thickness of the first portion 521 is greater than a thickness of the second portion 522. In some embodiments, the thickness of the second portion 522 is consistent while the thickness of the first portion is varies.

It should be noted that the diffusion barrier structure 52 is an effective metal diffusion barrier structure. For example, the diffusion barrier structure 52 is an effective copper (Cu) diffusion barrier structure. It is known that metal, such as Cu, used in the BEOL metallization layer may diffuse into an adjacent element and thus degrade device performance. Therefore, the diffusion barrier structure 52 including materials that are thermally stable with Cu is provided to mitigate Cu diffusion. Other than the Cu-diffusion barrier function, the diffusion barrier structure 52 provided by the present disclosure further includes a heat conduction function. In some embodiments, a thermal conductivity of the diffusion barrier structure 52 is greater than approximately 20 watts per meter kelvin (W/mK) in order to improve heat dissipation. In some embodiments, the diffusion barrier structure 52 can include metal, metal nitride, or two dimensional (2D) materials.

In some embodiments, the diffusion barrier structure 52 includes a single-layer structure, as shown in FIG. 11A. In such embodiments, the diffusion barrier structure 52 can include metal nitride such as titanium nitride (TiN), which has a thermal conductivity of approximately 28.8 W/mK, but the disclosure is not limited thereto. In other embodiments, the diffusion barrier structure 52 can include 2D material such as graphene, molybdenum disulfide ($MoS_2$) or hexagonal boron nitride (h-BN). The thermal conductivity of graphene is between approximately 2000 W/mK and approximately 4000 W/mK, the thermal conductivity of $MoS_2$ is between approximately 98 W/mK and approximately 138 W/mK, and the thermal conductivity of h-BN is between approximately 1700 W/mK and approximately 2000 W/mK; all of these are greater than 20 W/mK. In some embodiments, a thickness of the single-layered diffusion barrier structure 52 is between approximately 70 angstroms and approximately 200 angstroms, but the disclosure is not limited thereto.

Figure 12:
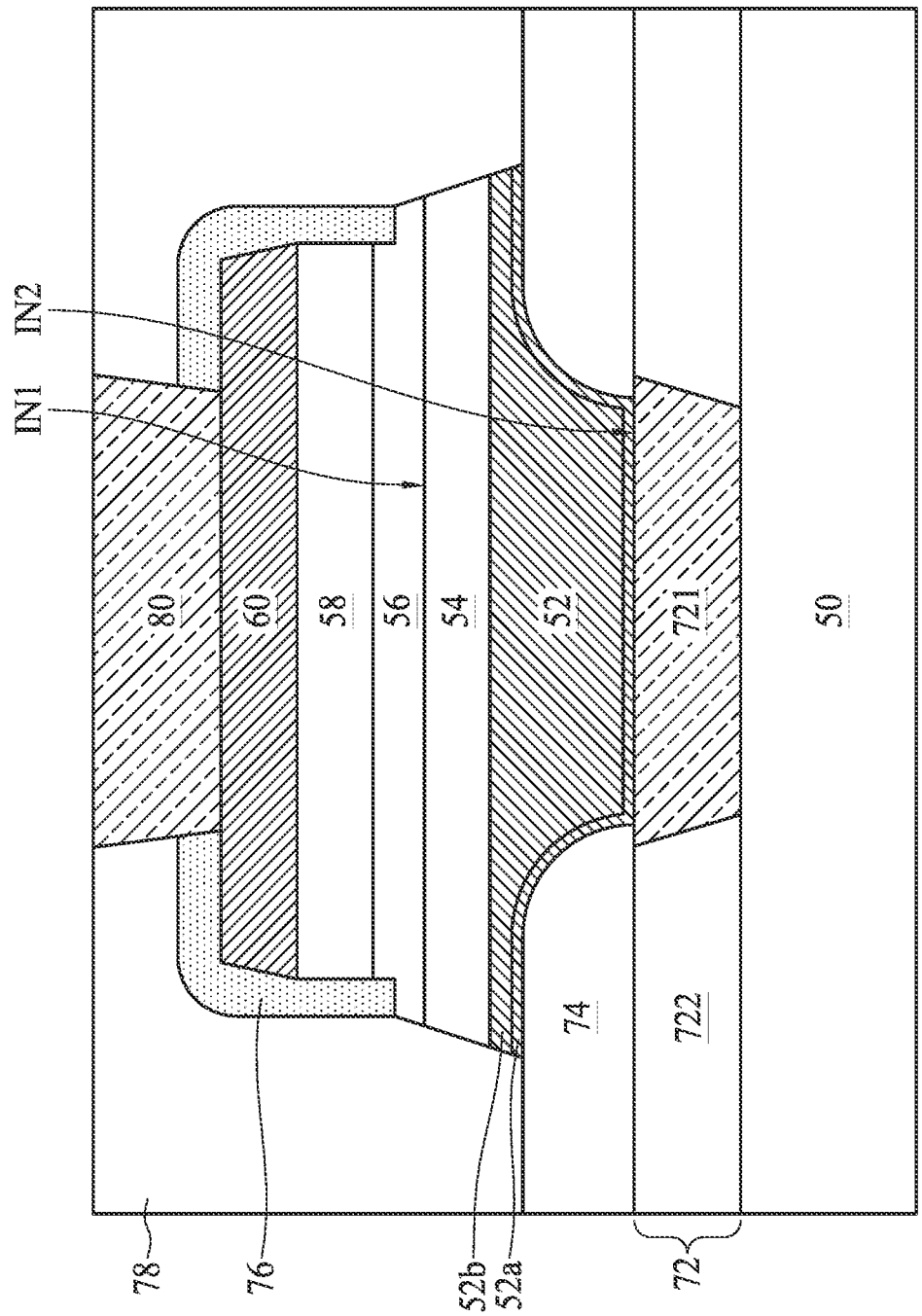
FIG. 12 is a schematic cross-sectional view of a semiconductor device according to some embodiments of the present disclosure.

In some embodiments, the diffusion barrier structure 52 includes a multiple-layer structure. In such embodiments, the diffusion barrier structure 52 includes metal and metal nitride. For example, the diffusion barrier structure 52 may include a tantalum nitride (TaN) layer 52a and a tantalum (Ta) layer 52b (shown in FIG. 12). Further, the TaN layer 52a is in contact with the bottom metallization layer 721. In such embodiments, a nitrogen concentration in the TaN layer 52a is between approximately 10% and approximately 40%, in order to provide effective diffusion barrier function. However, it is found that the thermal conductivity of TaN is approximately 3.4 W/mK, which is much less than 20 W/mK. To increase thermal conductivity, the Ta layer 52b, which has a thermal conductivity of approximately 57.5 W/mK, is provided. Additionally, a thickness of the Ta layer 52b is greater than a thickness of the TaN layer 52a. In some embodiments, the TaN layer 52a can be conformally formed in the opening 74R, and the Ta layer 52b is subsequently formed to fill the opening 74R, as shown in FIG. 12.

Figure 13:
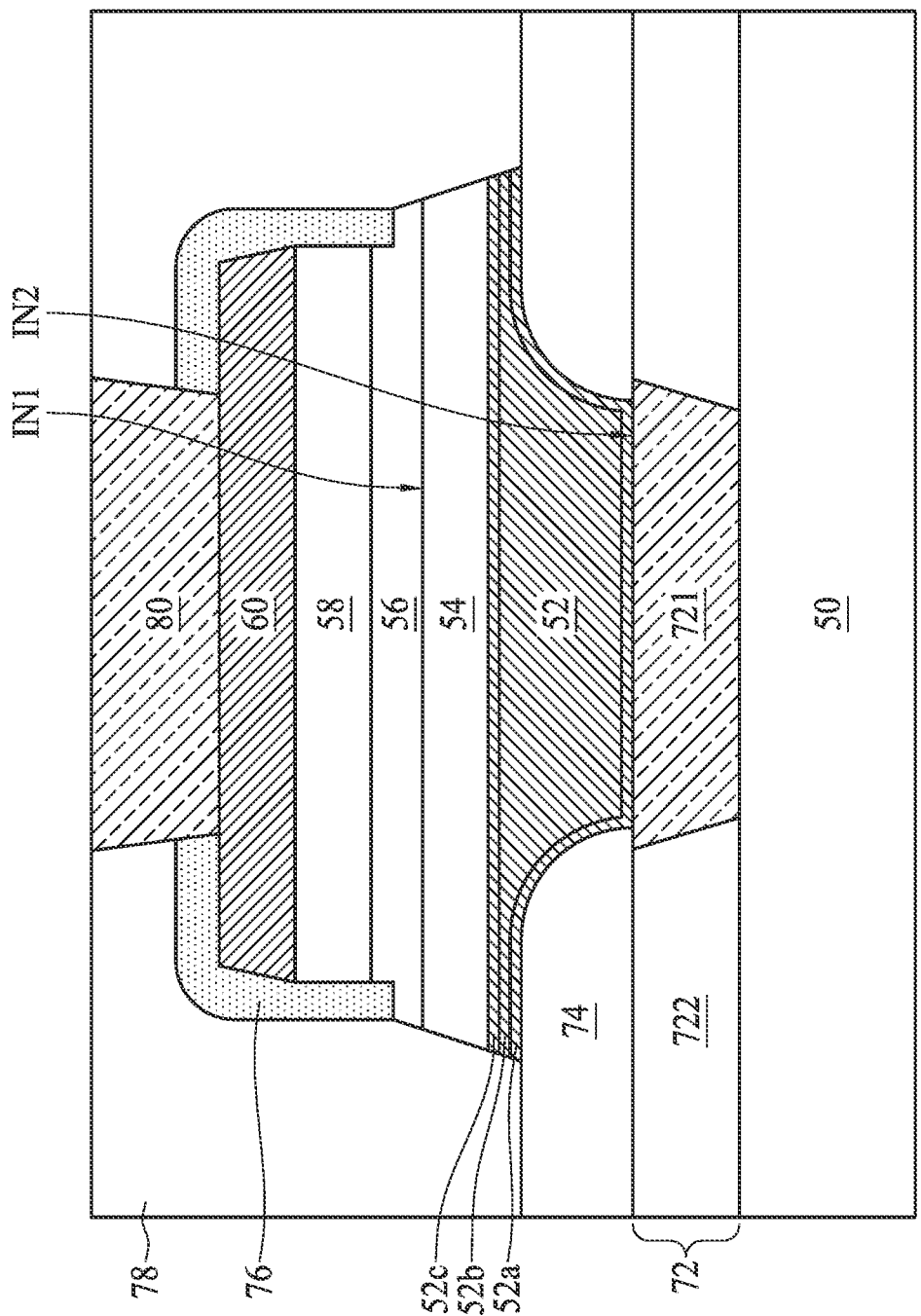
FIG. 13 is a schematic cross-sectional view of a semiconductor device according to some embodiments of the present disclosure.

In other embodiments, the diffusion barrier structure 52 may include a first TaN layer 52a, a second TaN layer 52c and a Ta layer 52b disposed between the first and second TaN layers 52a and 52c (shown in FIG. 13). In other words, a TaN/Ta/TaN structure can be provided. In such embodiments, a nitrogen concentration in the first and second TaN layers 52a and 52c is between approximately 10% and approximately 40%, in order to provide effective diffusion barrier function, while the Ta layer 52b is provided to increase thermal conductivity. A thickness of the Ta layer 52b is greater than a sum of the thicknesses of the first and second TaN layers 52a and 52c. For example, the thickness of each of the first and second TaN layers 52a and 52c can be between approximately 10 angstroms and 30 angstroms, while the thickness of the Ta layer 52b is between approximately 30 angstroms and 70 angstroms. In some embodiments, the first TaN layer 52a can be conformally formed in the opening 74R, the Ta layer 52b is subsequently formed to fill the opening 74R, and the second TaN layer 52c is formed over the Ta layer 52b, as shown in FIG. 13. Consequently, a top surface of the Ta layer 52b and a top surface of the TaN layer 52c may be substantially planar, but the disclosure is not limited thereto.

Figure 11B:
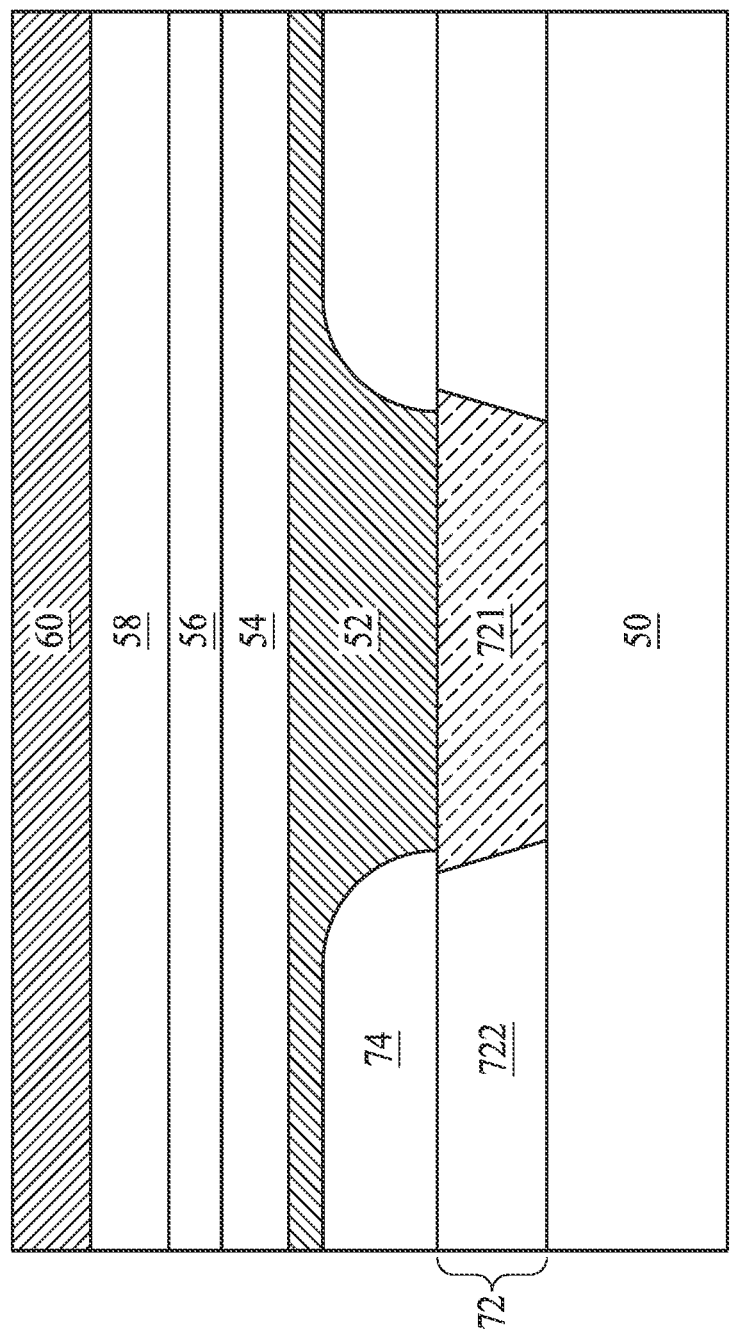

Referring to FIG. 11B, subsequently, a bottom electrode 54 is formed over the diffusion barrier structure 52 in operation 530. In some embodiments, when the diffusion barrier structure 52 includes the TaN/Ta multiple layer, the Ta layer 52b abuts the bottom electrode 54 (shown in FIG. 12). Examples of conductive material for the bottom electrode 54 may include metal such as gold (Au), platinum (Pt), ruthenium (Ru), iridium (Ir), or the like.

Still referring to FIG. 11B, a switching layer 56 is formed over the bottom electrode 54 in operation 540. The switching layer 56 may include a data storage region configured to store data, and a variable resistance of the data storage region may represent a data unit, such as a bit of data.

As shown in FIG. 11B, a capping layer 58 is formed over the switching layer 56 in operation 550. In some embodiments, the method 500 functions to form a conductive bridge random access memory (CBRAM), which employs active metal ions in the capping layer 58 to form conductive filaments. Therefore, the capping layer 58 is also referred to as a metal reservoir layer, which is configured as an active metal reservoir region to store active metal ions such as copper ions, silver ions, aluminum ions or the like.

A top electrode 60 is formed over the capping layer 58 in operation 560. In some embodiments, the bottom electrode 54, the switching layer 56, the capping layer 58 and the top electrode 60, together including the diffusion barrier structure 52, may have substantially planar upper surfaces. The materials for the switching layer 56, the capping layer 58 and the top electrode 60 may be the same as those of the aforementioned embodiments, and are not redundantly described.

Figure 11C:
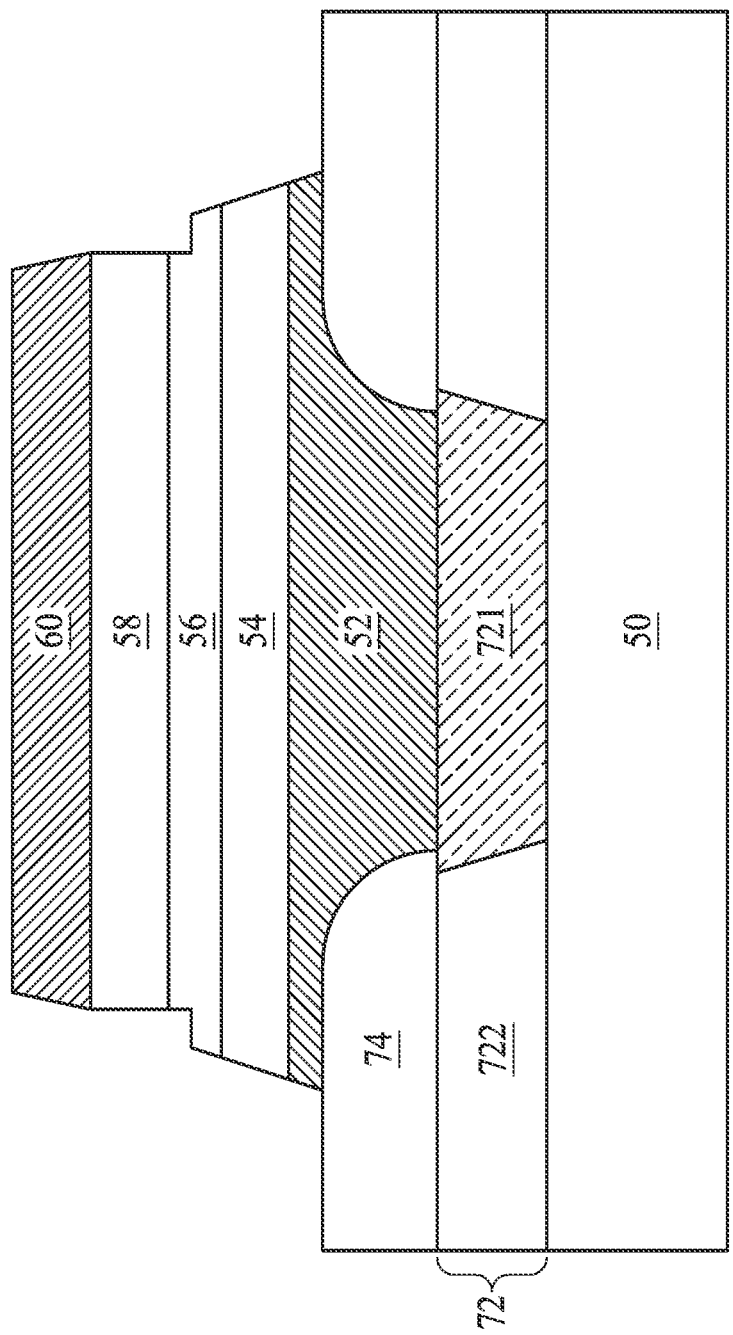

In some embodiments, a mask layer (not shown) can be formed over the top electrode 60. The mask layer covers a portion of the top electrode 60, and exposes the rest of the top electrode 60. In some embodiments, the mask layer may include a photoresist layer, but is not limited thereto. As shown in FIG. 11C, the top electrode 60, the capping layer 58, the switching layer 56, the bottom electrode 54 and the diffusion barrier structure 52 are patterned through the mask layer. In some embodiments, the top electrode 60, the capping layer 58, the switching layer 56, the bottom electrode 54 and the diffusion barrier structure 52 are patterned by etching. In some embodiments, the etching may include dry etching, wet etching or a combination thereof. The top electrode 60, the capping layer 58, the switching layer 56, the bottom electrode 54 and the diffusion barrier structure 52 may be patterned by one etching operation, or by multiple etching operations. In some embodiments, a width of the diffusion barrier structure 52 and a width of the bottom electrode 54 may be greater than a width of the capping layer 58 and a width of the top electrode 60, but the disclosure is not limited thereto. In such embodiments, a portion of the upper surface of the bottom electrode 54 or a portion of the switching layer 56 may be exposed, but the disclosure is not limited thereto. The mask layer may be removed after the top electrode 60, the capping layer 58, the switching layer 56, the bottom electrode 54 and the diffusion barrier structure 52 are patterned.

Figure 11D:
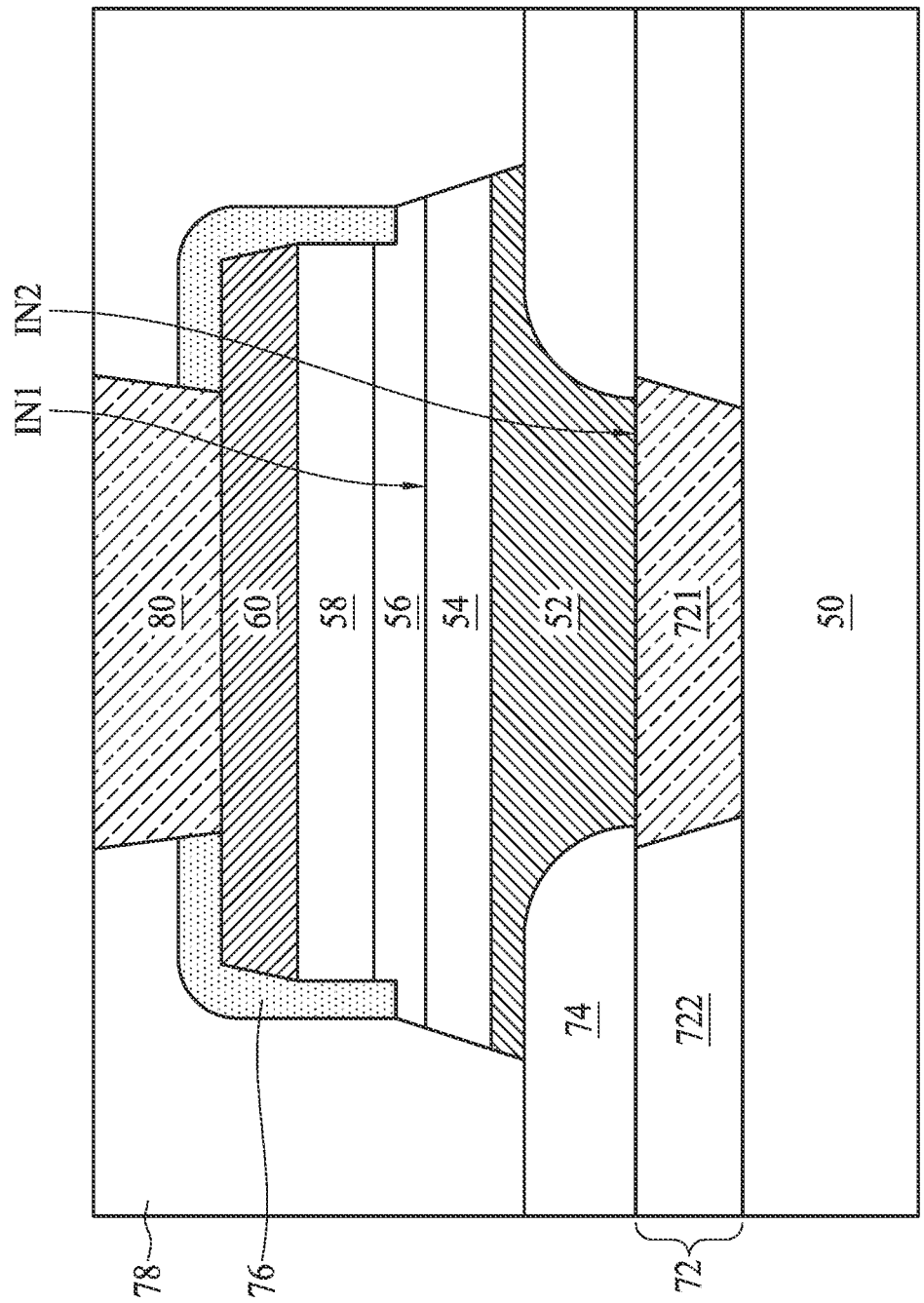

As shown in FIG. 11D, a passivation layer 76 can be optionally formed. In some embodiments, the passivation layer 76 is insulative. In some embodiments, the passivation layer 76 covers the upper surface of the top electrode 60. In some embodiments, the passivation layer 76 covers sidewalls of the top electrode 60, sidewalls of the capping layer 58 and sidewalls of a portion of the switching layer 56. The material of the passivation layer 76 can be similar to those mentioned above, and therefore such details are omitted for brevity.

Still referring to FIG. 11D, a top ILD layer 78 is formed over the substrate 50, covering the passivation layer 76. The material of the top ILD layer 78 may be similar to those mentioned above, and therefore such details are omitted. The top ILD layer 78 and the passivation layer 76 may be patterned by, e.g., photolithography and etching techniques, to expose a portion of the top electrode 60. In some embodiments, a top metallization layer 80 is formed, and electrically connected to the top electrode 60 to form a semiconductor device 5. The material of the top metallization layer 60 may be similar to those mentioned above, and therefore such details are omitted. The semiconductor device 5 is a planar type semiconductor device, in which the top electrode 60, the capping layer 58, the switching layer 56, the bottom electrode 54 and the diffusion barrier structure 52 may have planar upper surfaces.

Figure 14:
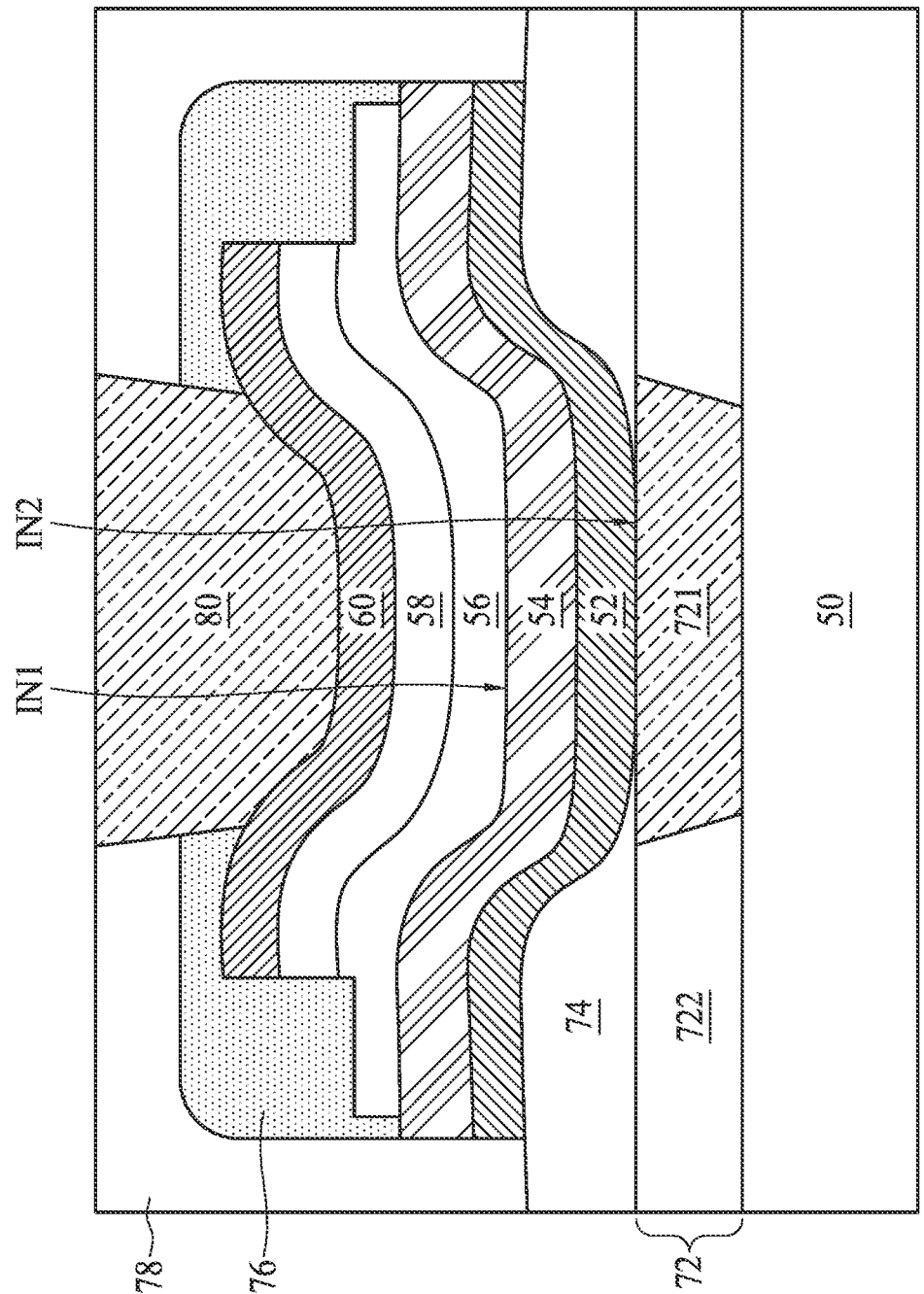
FIG. 14 is a schematic cross-sectional view of a semiconductor device according to some embodiments of the present disclosure.

Please refer to FIG. 14, which is a schematic cross-sectional view of a semiconductor device according to some embodiments of the present disclosure. As shown in FIG. 14, in contrast to the semiconductor device 5 of FIG. 11D, the semiconductor device 6 is a non-planar type semiconductor device, in which the upper surface of the diffusion barrier structure 52 and the bottom electrode 54 are recessed. In some embodiments, the upper surfaces of the top electrode 60, the capping layer 58 and the switching layer 56 may be non-planar. For example, the upper surfaces of the top electrode 60, the capping layer 58 and the switching layer 56 may be recessed. In such embodiments, the diffusion barrier structure 52 may have a consistent thickness. When the diffusion barrier structure 52 is a single-layered structure, the diffusion barrier structure 52 may have a consistent thickness. When the diffusion barrier structure 52 is a multiple-layered structure, all layers (e.g., TaN layers 52a and 52c and Ta layer 52b) of the diffusion barrier structure 52 may have a consistent thickness.

In some embodiments, the semiconductor devices 5 and 6 may be driven by a transistor device. By way of example, the bottom metallization layer 721 may be electrically connected to a drain electrode of a transistor device. The source electrode of the transistor device may be electrically connected to a source line, and the gate electrode of the transistor device may be electrically connected to a word line. The top metallization layer 80 may be electrically connected to a bit line. In other embodiments, the semiconductor devices 5 and 6 may be driven by a pair of transistor devices. By way of example, the bottom metallization layer 721 may be electrically connected to a common drain electrode of a transistor device. The source electrodes of the pair of transistor devices may be electrically connected to source lines, and the gate electrodes of the transistor device may be electrically connected to word lines. The top metallization layer 80 may be electrically connected to a bit line.

Referring to FIGS. 11D to 14, with the CBRAM semiconductor devices 5 and 6, the initialization operation can be performed to emigrate active metal ions from the capping layer 58 to the switching layer 56, thereby forming metal bridges, i.e., conductive filaments in the switching layer 56.

The semiconductor devices 5 and 6 may also undergo a baking operation to verity data retention at high temperatures. After the initialization operation, the semiconductor devices 5 and 6 can be operated in a reset state or in a set state. In a reset operation, a reset voltage is applied across the top electrode 60 and the bottom electrode 54 to switch the switching layer 56 from a lower resistance state (LRS) to a high resistance state (HRS), thereby breaking the conductive filaments to increase resistivity. In a set operation, a set voltage is applied across the top electrode 60 and the bottom electrode 54 to switch the switching layer 56 from the high resistance state to the lower resistance state, thereby re-forming the conductive filaments to reduce resistivity.

During the set operation, the conductive filament may be formed with a temperature greater than approximately 900° C. due to Joule heating. It is found that in some comparative embodiments, which adopt a TaN layer serving as a diffusion barrier layer between the bottom electrode and the bottom metallization layer, heat accumulates in the bottom electrode because of the poor thermal conductivity of the TaN layer (less than approximately 3.4). In detail, because the thermal conductivity of the TaN layer is less than approximately 3.4, heat cannot be efficiently dissipated and may accumulate in an interface between the bottom electrode and the switching layer. Consequently, metal-oxide bonds are easily broken due to the heat accumulation, and the conductive filament cannot be broken during the reset operation. In other words, a large leak path may be formed and the CBRAM is not easy to close, and thus a bit error rate (BER) is increased.

To mitigate the BER issue, the diffusion barrier structure 52 is provided. As mentioned above, the conductivity of the diffusion barrier structure 52 is greater than approximately 20 W/mK; therefore, heat generated during the set operation can be easily dissipated from an interface IN1 between the switching layer 56 and the bottom electrode 54 to an interface IN2 between the barrier diffusion structure 52 and the bottom metallization layer 721, and thus heat accumulation at the interface IN1 is reduced. Consequently, the conductive filament can be easily broken in the reset operation and BER can be reduced.

It should be noted that the diffusion barrier structure 52 in the semiconductor devices 5 and 6 has potential issues in at least two areas: the metal diffusion barrier and the thermal conductivity. For example, TaN may form an effective metal diffusion barrier, but suffers from poor thermal conduction. Therefore, the Ta layer can be provided over the TaN layer or sandwiched between the TaN layers to provide efficient heat dissipation. It should be noted that the Ta layer itself is not a preferred diffusion barrier structure because Ta is easily oxidized and thus resistivity may be increased.

In some embodiments of the present disclosure, the semiconductor device includes a diffusion barrier structure interposed between the bottom electrode and the bottom metallization layer. The material of the diffusion barrier structure is selected to provide diffusion barrier function and thermal conduction. Accordingly the diffusion barrier helps to obstruct metal diffusion and heat dissipation, and the BER issue is mitigated.

Figure 15:
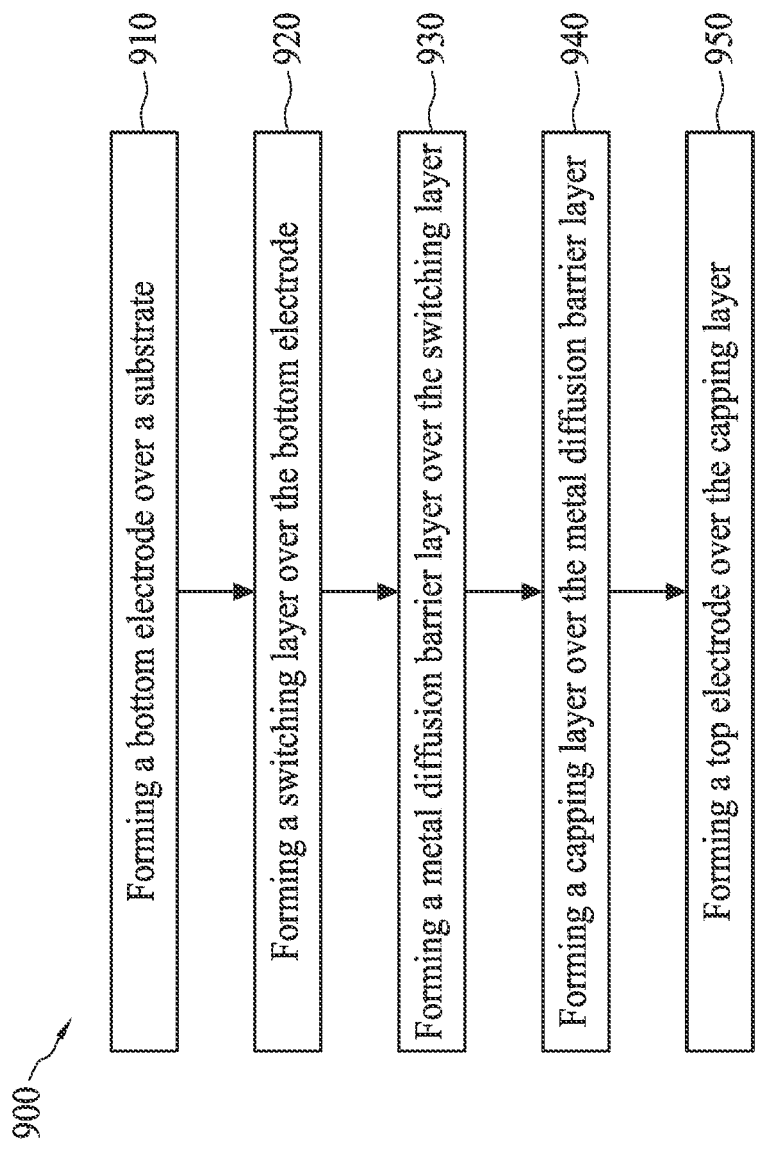
FIG. 15 is a flowchart illustrating a method for manufacturing a semiconductor device according to various aspects of one or more embodiments of the present disclosure.

FIG. 15 is a flowchart illustrating a method for manufacturing a semiconductor device according to various aspects of one or more embodiments of the present disclosure. The method 900 begins with operation 910, in which a bottom electrode is formed over a substrate. The method 900 proceeds with operation 920, in which a switching layer is formed over the bottom electrode. The method 900 continues with operation 930, in which a metal diffusion barrier layer is formed over the switching layer. The method 900 continues with operation 940, in which a capping layer is formed over the metal diffusion barrier layer. The method 900 continues with operation 950 in which a top electrode is formed over the capping layer.

The method 900 is merely an example to form a conductive bridge random access memory (CBRAM), and is not intended to limit the present disclosure beyond what is explicitly recited in the claims. Additional operations can be provided before, during, and after the method 900, and some operations described can be replaced, eliminated, or moved around for additional embodiments of the method.

Figure 16A:
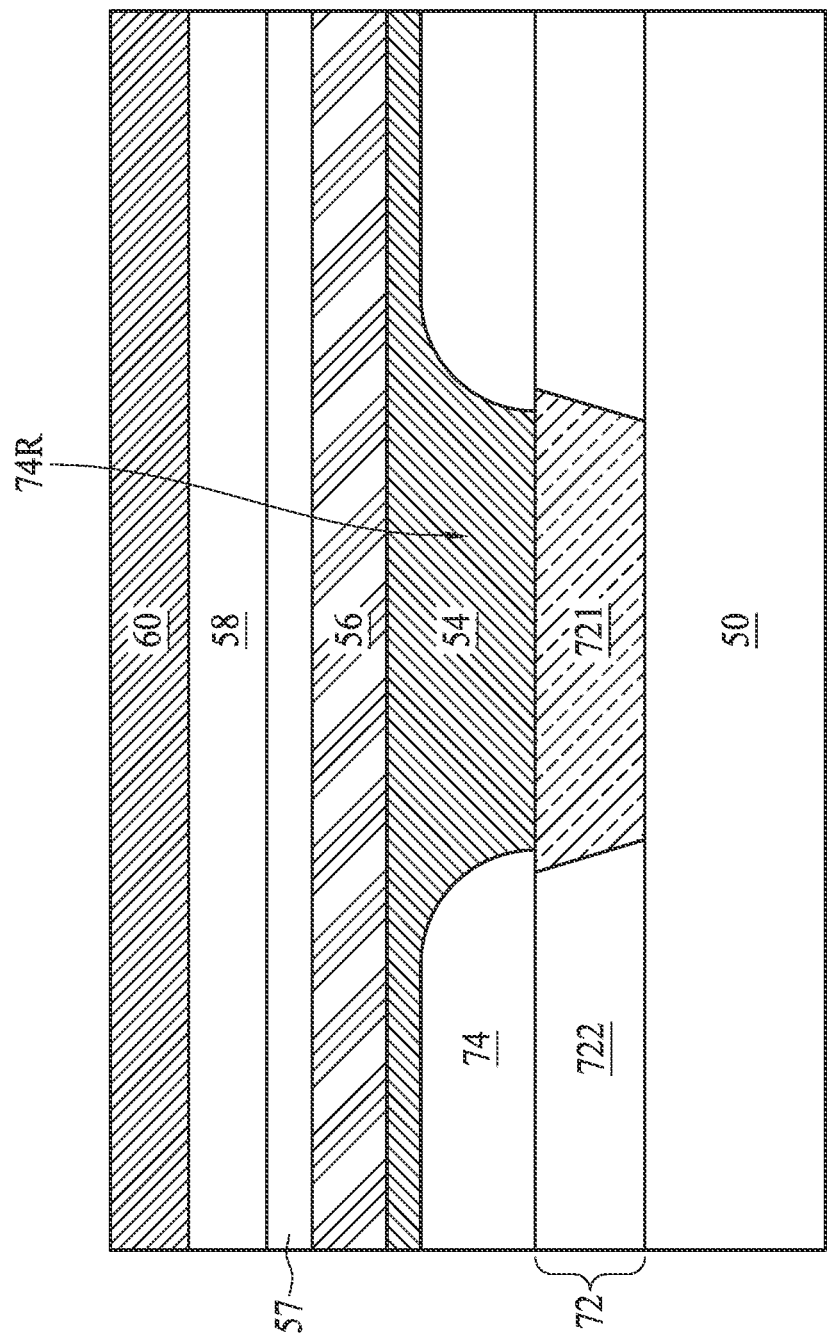
FIG. 16A, FIG. 16B, FIG. 16C and FIG. 16D are schematic views of various operations of manufacturing a semiconductor device according to one or more embodiments of the present disclosure.

FIG. 16A, FIG. 16B, FIG. 16C and FIG. 16D are schematic views of various stages in the manufacturing of a semiconductor device according to one or more embodiments of the present disclosure. To simplify the description and for the convenience of comparison of the embodiments of the present disclosure, the identical components in each of the following embodiments are marked with identical numerals and have similar materials, and thus those details are omitted for brevity. To facilitate comparison of the embodiments, the following description will detail the dissimilarities among different embodiments and the identical features will not be redundantly described. As shown in FIG. 16A, a substrate 50 is received. A bottom interconnect structure 72 may be formed over the substrate 50. In some embodiments, the bottom interconnect structure 72 includes a bottom metallization layer 721, and a bottom ILD layer 722 laterally surrounding the bottom metallization layer 721. A dielectric layer 74 is formed over the substrate 50. The dielectric layer 74 may include an opening 74R exposing a portion of the bottom metallization layer 721.

Referring to FIG. 16A, a bottom electrode 54 is formed over the substrate 50 in operation 910. As shown in FIG. 16A, the bottom electrode 54 is in contact with the bottom metallization layer 721. In some embodiments, the bottom electrode 54 is conformally formed in the opening 74R and includes a consistent thickness (shown in FIG. 17). In other embodiments, the bottom electrode 54 may be formed to fill the opening 74R and thus may have a substantially planar upper surface, as shown in FIG. 16A.

A switching layer 56 is formed over the bottom electrode 54 in operation 920. The switching layer 56 may include a data storage region configured to store data. As mentioned above, a variable resistance of the data storage region may represent a data unit, such as a bit of data.

Still referring to FIG. 16A, a metal diffusion barrier layer 57 is formed over the switching layer 56 in operation 930. A material of the metal diffusion barrier layer 57 may include metal, metal nitride or a combination thereof. In some embodiments, the metal diffusion barrier layer 57 can include metal, and the metal includes at least one of iridium (Ir), ruthenium (Ru), platinum (Pt), tantalum (Ta), titanium (Ti), titanium tungsten (TiW) and tungsten (W). In other embodiments, the metal diffusion barrier layer 57 can include metal nitride, and the metal nitride can include at least one of titanium tungsten nitride (TiW(N)), titanium nitride (TiN) and tungsten nitride (WN). In some embodiments, a thickness of the metal diffusion barrier layer 57 is between approximately 2 angstroms and approximately 25 angstroms, but the disclosure is not limited thereto. The metal diffusion barrier layer 57 helps to obstruct diffusion of metal ions to the switching layer 56. It should be noted that in some comparative embodiments, when the thickness of the metal diffusion barrier layer is less than 2 angstroms, the metal diffusion barrier layer is too thin to be an effective barrier layer. However in other comparative embodiments, in which the thickness of the metal diffusion barrier layer is greater than 25 angstroms, the metal diffusion barrier layer is so thick that the resistance of the semiconductor device is undesirably increased.

Still referring to FIG. 16A, a capping layer 58 is formed over the metal diffusion barrier layer 57 in operation 940. As mentioned above, the capping layer 58 is referred to as a metal reservoir layer, which is configured as an active metal reservoir region to store active metal ions. A top electrode 60 is formed over the capping layer 58 in operation 950. In some embodiments, the bottom electrode 54, the switching layer 56, the metal diffusion barrier layer 57 the capping layer 58 and the top electrode 60 may have substantially planar upper surfaces.

Figure 16B:
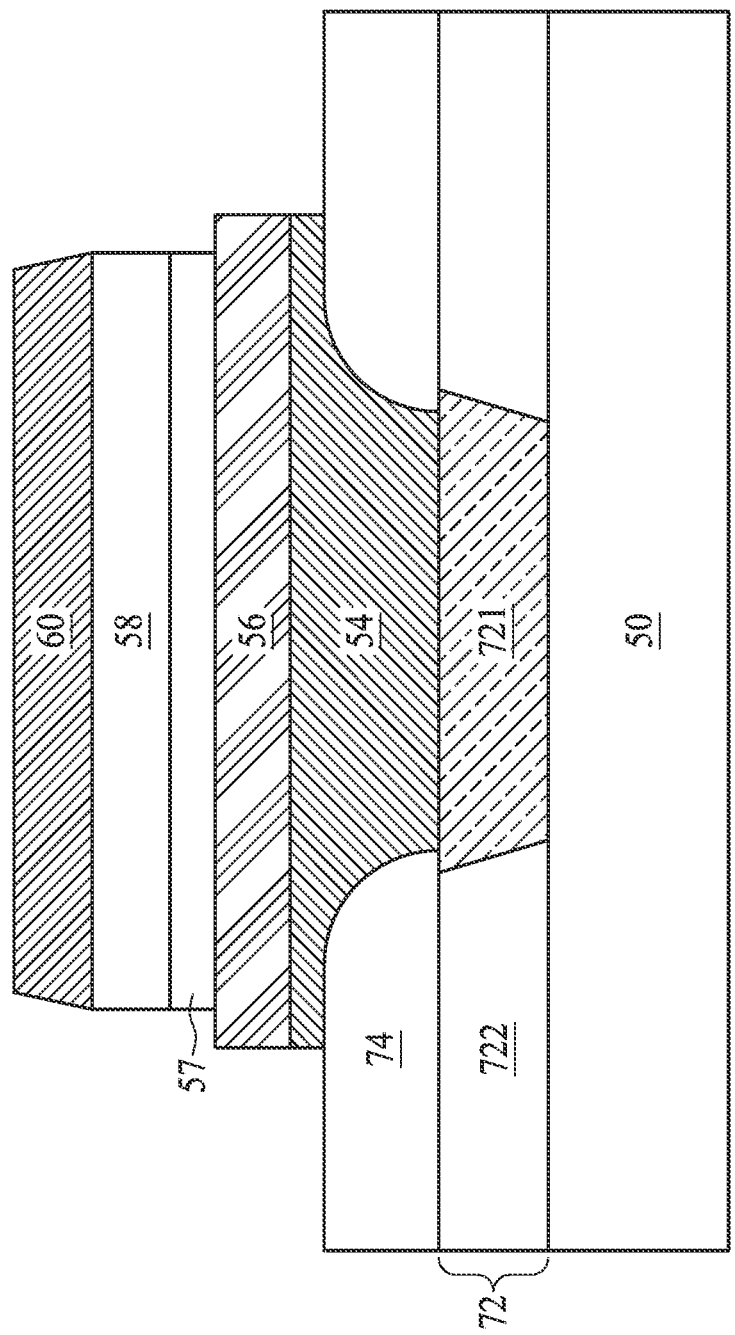

Referring to FIG. 16B, the top electrode 60, the capping layer 58, the metal diffusion barrier layer 57, the switching layer 56 and the bottom electrode 54 are patterned by etching. In some embodiments, the etching may include dry etching, wet etching or a combination thereof. The top electrode 60, the capping layer 58, the metal diffusion barrier layer 57, the switching layer 56 and the bottom electrode 54 may be patterned by one etching operation, or by multiple etching operations. In some embodiments, a width of the bottom electrode 54 and a width of the switching layer 56 may be greater than a width of the capping layer 58, a width of the metal diffusion barrier layer 57 and a width of the top electrode 60, but the disclosure is not limited thereto. In such embodiments, a portion of the upper surface of the switching layer 56 may be exposed, but the disclosure is not limited thereto.

Figure 16C:
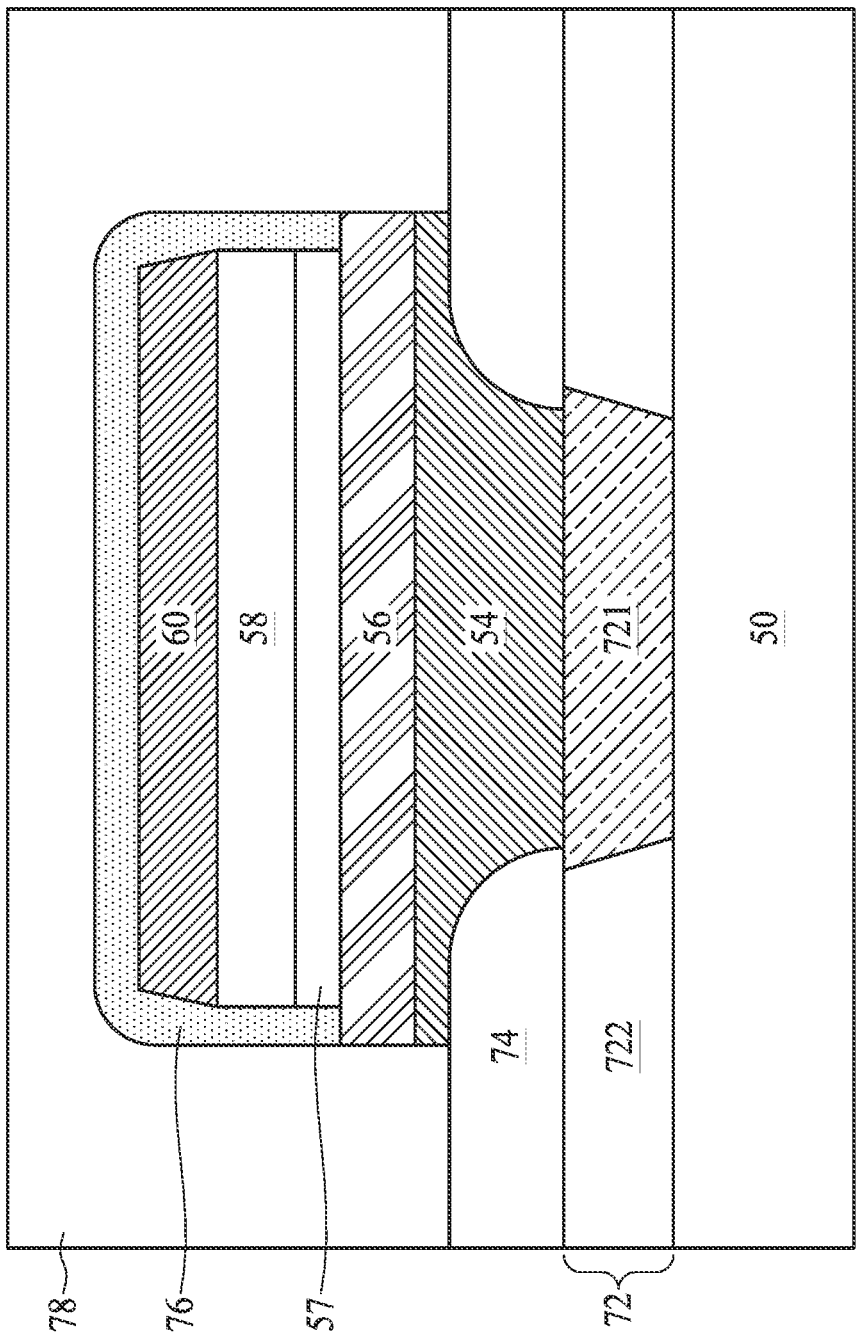

Referring to FIG. 16C, a passivation layer 76 can be optionally formed. In some embodiments, the passivation layer 76 is insulative. In some embodiments, the passivation layer 76 covers the upper surface of the top electrode 60. In some embodiments, the passivation layer 76 covers sidewalls of the top electrode 60, sidewalls of the capping layer 58 and sidewalls of the metal diffusion barrier layer 57. In some embodiments, the passivation layer 76 further covers a portion of the top surface of the switching layer 56.

Figure 16D:
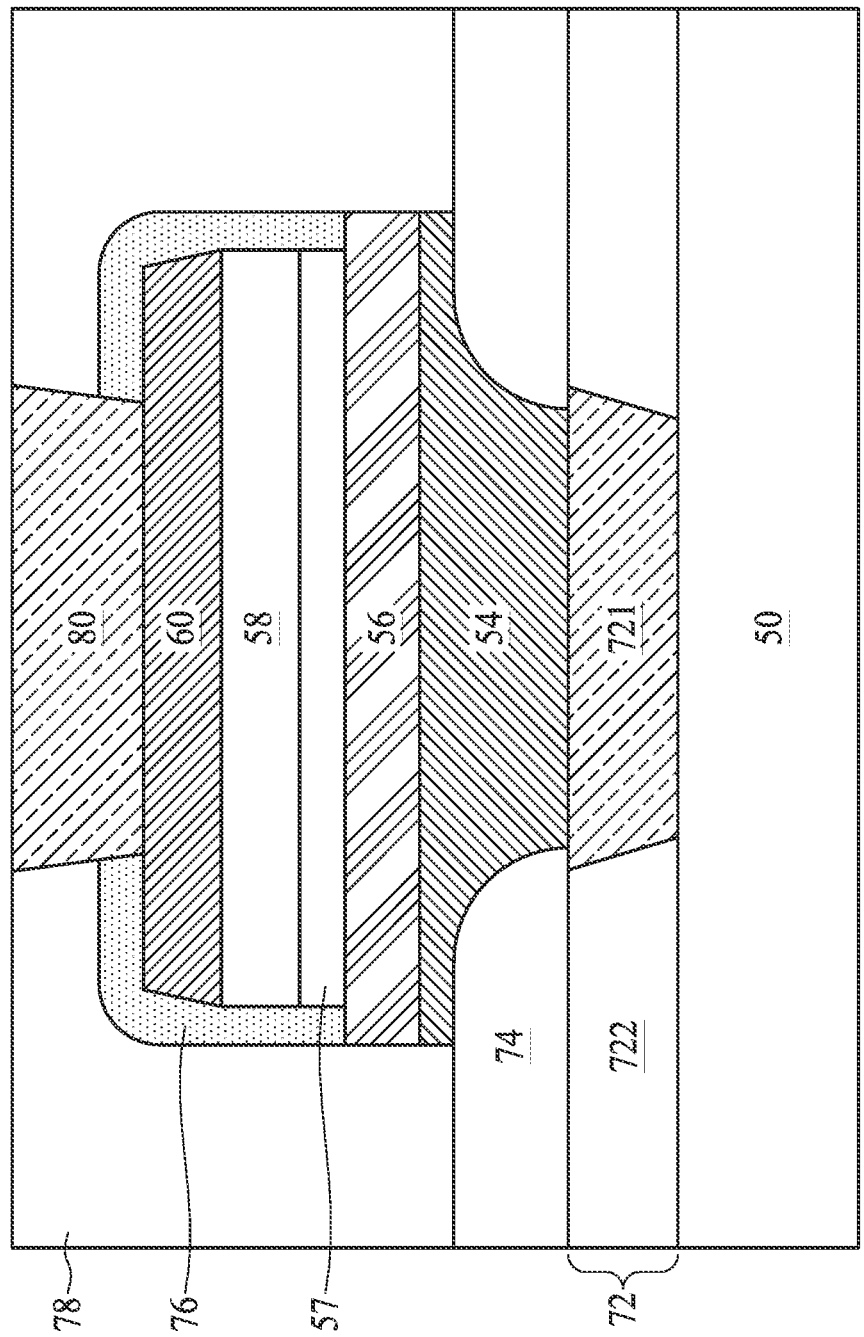

Still referring to FIG. 16C, a top ILD layer 78 is formed over the substrate 50, covering the passivation layer 76. Referring to FIG. 16D, the top ILD layer 78 and the passivation layer 76 may be patterned by, e.g., photolithography and etching techniques, to expose a portion of the top electrode 60. In some embodiments, a top metallization layer 80 is formed, and electrically connected to the top electrode 60 to form a semiconductor device 7. The semiconductor device 7 is a planar type semiconductor device, in which the top electrode 60, the capping layer 58, the metal diffusion barrier layer 57, the switching layer 56 and the bottom electrode 54 may have planar upper surfaces.

Figure 17:
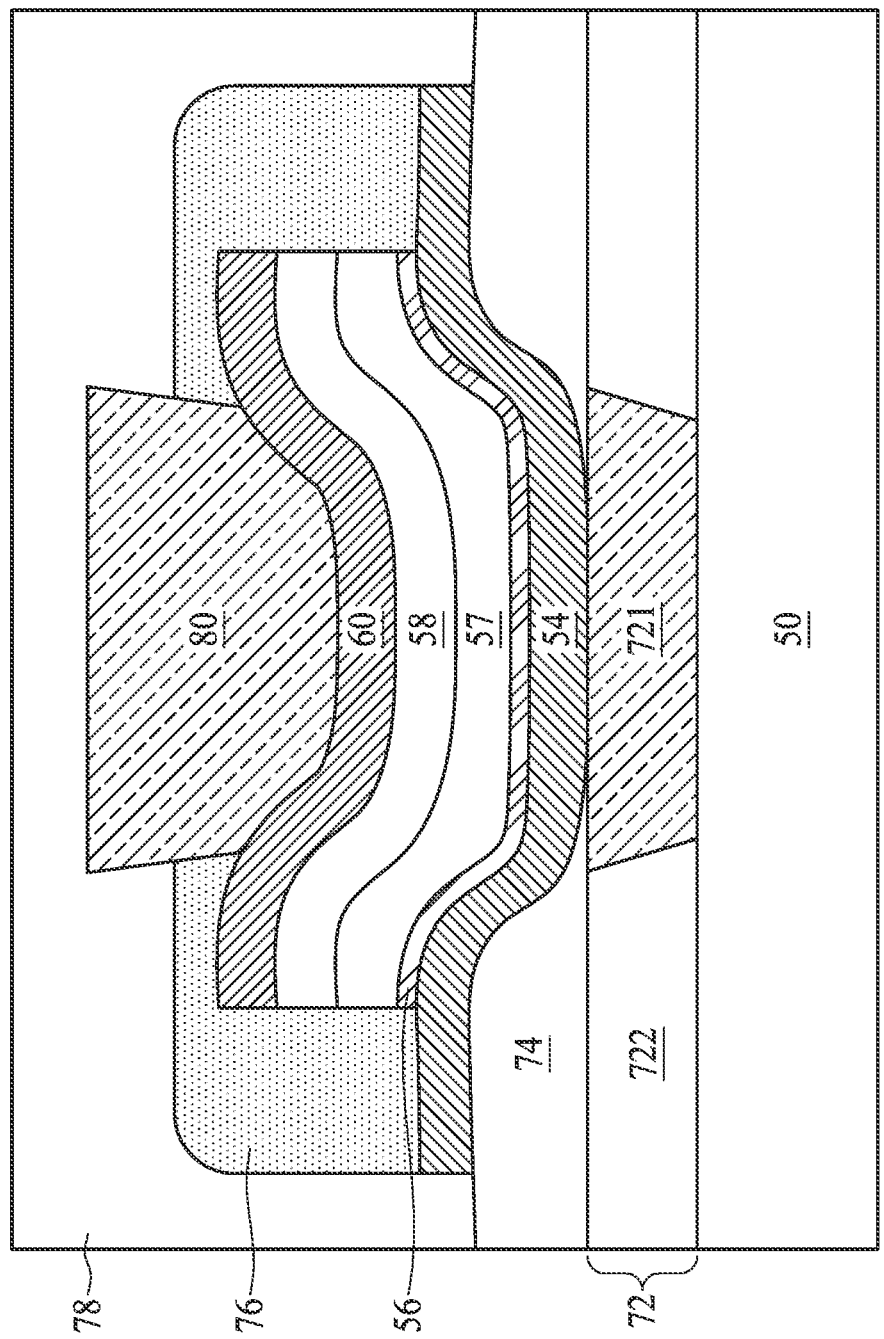
FIG. 17 is a schematic cross-sectional view of a semiconductor device according to some embodiments of the present disclosure.

Please refer to FIG. 17, which is a schematic cross-sectional view of a semiconductor device according to some embodiments of the present disclosure. As shown in FIG. 17, in contrast to the semiconductor device 7 of FIG. 16C, the semiconductor device 8 is a non-planar type semiconductor device, in which the upper surface of the bottom electrode 54 is recessed. In some embodiments, the upper surfaces of the top electrode 60, the capping layer 58, the metal diffusion barrier layer 57 and the switching layer 56 may be non-planar. For example, the upper surfaces of the top electrode 60, the capping layer 58, the metal diffusion barrier layer 57 and the switching layer 56 may be recessed. In such embodiments, the bottom electrode 54 may have a consistent thickness.

As mentioned above, the semiconductor devices 7 and 8 may be driven by a transistor device. By way of example, the bottom metallization layer 721 may be electrically connected to a drain electrode of a transistor device. The source electrode of the transistor device may be electrically connected to a source line, and the gate electrode of the transistor device may be electrically connected to a word line. The top metallization layer 80 may be electrically connected to a bit line. In other embodiments, the semiconductor devices 7 and 8 may be driven by a pair of transistor devices. By way of example, the bottom metallization layer 721 may be electrically connected to a common drain electrode of a transistor device. The source electrodes of the pair of transistor devices may be electrically connected to source lines, and the gate electrodes of the transistor device may be electrically connected to word lines. The top metallization layer 80 may be electrically connected to a bit line.

Figure 18B:
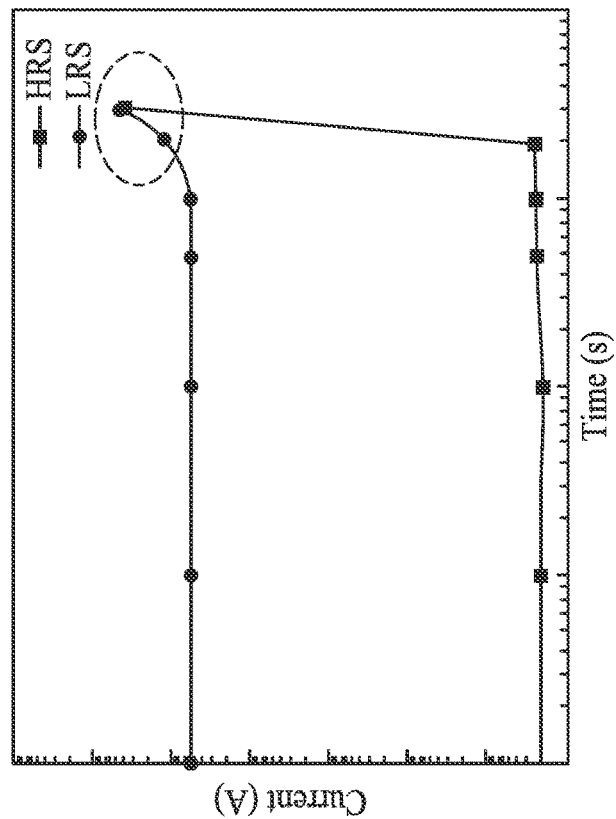
FIG. 18A and FIG. 18B are plots of a simulation result of an LRS/HRS window in accordance with comparative embodiments and some embodiments of the present disclosure.
Figure 18A:
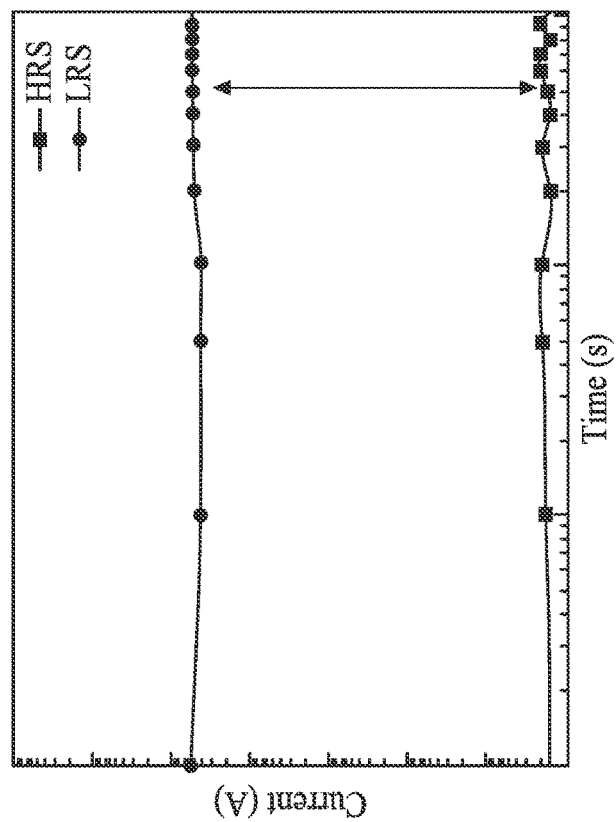

Please refer to FIG. 18A and FIG. 18B, which are plots of a simulation result of LRS/HRS windows in accordance with comparative embodiments and some embodiments of the present disclosure. An initialization operation, a baking operation (for retention), a set operation and a reset operation of the semiconductor devices 7 and 8 may be similar to those mentioned above, and therefore such details are omitted for brevity. It is found that unwanted metal ion diffusion may occur during the retention and set operations due to temperatures reaching the ionization temperature of the metals. For example, ionization temperature of Al is approximately 87.8° C., ionization temperature of Cu is approximately 69.3° C., and ionization temperature of Ag is approximately 89.6° C. That means that such metals may be ionized and diffused at the ionization temperature. In some embodiments, retention occur at approximately 125° C. and a set operation may be performed on the conductive filament at a temperature greater than approximately 900° C., and therefore some of the metal ions may be ionized and diffused from the capping layer 58 to the switching layer 16, thereby adversely breaking the conductive filaments and the set/reset cycling. As shown in FIG. 18A, in such comparative embodiments, currents at a high resistant state and at a low resistant state may be the same. It is well known that the LRS and the HRS correspond to logical "1" and logical "0" states (or vice versa), respectively, and the presence of identical currents at both of the LRS and the HRS indicates that retention is failed.

To mitigate the retention failure issue, the metal diffusion barrier layer 57 is provided. The metal diffusion barrier layer 57 helps to obstruct diffusion of metal ions from the metal reservoir layer 58 to the switching layer 56, and therefore the conductive filament can be formed at the LRS and be broken at the HRS, as expected during cycling and retention. In some embodiments, it is found that a current ratio of LRS to HRS (sometimes referred to as an on-off ratio) can be greater than $10^4$, as shown in FIG. 18B. Consequently, retention failure issue is mitigated and leakage is reduced.

In some embodiments, the metal diffusion barrier layer is interposed between the capping layer and the switching layer. The material of the diffusion barrier layer is selected to obstruct metal diffusion from the metal reservoir layer to the switching layer during cycling and retention. The diffusion barrier layer can improve the cycling and retention performance of semiconductor device.

In some embodiments, a semiconductor device includes a diffusion barrier structure, a bottom electrode, a top electrode, a switching layer and a capping layer. The bottom electrode is over the diffusion barrier structure. The top electrode is over the bottom electrode. The switching layer is between the bottom electrode and the top electrode, and configured to store data. The capping layer is between the switching layer and the top electrode. The diffusion barrier structure includes a multiple-layer structure. A thermal conductivity of the diffusion barrier structure is greater than approximately 20 W/mK.

In some embodiments, a semiconductor device includes a bottom electrode, a top electrode, a switching layer, a metal reservoir layer and a metal diffusion barrier layer. The top electrode is over the bottom electrode. The switching layer is between the bottom electrode and the top electrode, and configured to store data. The metal reservoir layer is between the switching layer and the top electrode. The metal diffusion barrier layer is between the metal reservoir layer and the switching layer, wherein the metal diffusion barrier layer is configured to obstruct diffusion of metal ions from the metal reservoir layer to the switching layer.

In some embodiments, a method for manufacturing a semiconductor device includes the following operations. A dielectric layer is formed over a substrate, wherein the dielectric layer has an opening formed therein. A diffusion barrier structure is formed in the opening. A bottom electrode is formed over the diffusion barrier structure. A switching layer is formed over the bottom electrode. A metal reservoir layer is formed over the switching layer. A top electrode is formed over the metal reservoir layer. A thermal conductivity of the diffusion barrier structure is greater than approximately 20 W/mK.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a diffusion barrier structure, wherein the diffusion barrier structure comprises a multiple-layer structure, and the diffusion barrier structure comprises a tantalum (Ta) layer;
a bottom electrode, over the diffusion barrier structure, wherein the Ta layer of the diffusion barrier structure abuts the bottom electrode;
a top electrode, over the bottom electrode;
a switching layer, between the bottom electrode and the top electrode, and configured to store data; and
a capping layer, between the switching layer and the top electrode, wherein a thermal conductivity of the diffusion barrier structure is greater than approximately 20 watts per meter kelvin (W/mK).

2. The semiconductor device of claim 1, wherein a thermal conductivity of the bottom electrode is greater than the thermal conductivity of the diffusion barrier structure.

3. The semiconductor device of claim 1, wherein the diffusion barrier structure comprises a first portion and a second portion surrounding the first portion, and a thickness of the first portion is greater than a thickness of the second portion.

4. The semiconductor device of claim 1, wherein the switching layer directly physically contacts with a top surface of the bottom electrode.

5. The semiconductor device of claim 1, wherein a sidewall of the switching layer has an inclined portion, a vertical portion and a horizontal portion coupled with the vertical portion and the inclined portion.

6. The semiconductor device of claim 5, wherein the inclined portion has a first angle with respect to a bottom surface of the switching layer, the vertical portion has a second angle with respect to the bottom surface different from the first angle.

7. The semiconductor device of claim 5, wherein the inclined portion of the switching layer is in direct physical contact with an inter-layer dielectric layer.

8. The semiconductor device of claim 5, wherein the vertical portion of the switching layer is in direct physical contact with a passivation layer.

9. A semiconductor device, comprising:
a diffusion barrier structure, wherein the diffusion barrier structure comprises a tantalum nitride (TaN) layer and a tantalum (Ta) layer on the TaN layer;
a bottom electrode, over the diffusion barrier structure, wherein the bottom electrode abuts the Ta layer;
a top electrode, over the bottom electrode;
a switching layer, between the bottom electrode and the top electrode, and configured to store data; and
a capping layer, between the switching layer and the top electrode, wherein a thermal conductivity of the diffusion barrier structure is greater than approximately 20 watts per meter kelvin (W/mK).

10. The semiconductor device of claim 9, wherein the diffusion barrier structure comprises a first portion and a second portion surrounding the first portion, and a thickness of the first portion is greater than a thickness of the second portion.

11. The semiconductor device of claim 9, wherein a thickness of the Ta layer is greater than a thickness of the TaN layer.

12. The semiconductor device of claim 9, wherein a sidewall of the switching layer has a first portion, a second portion and a third portion connecting the first portion and the second portion.

13. The semiconductor device of claim 12, wherein the first portion of the switching layer is in direct physical contact with an inter-layer dielectric layer, and the second portion of the switching layer is in direct physical contact with a passivation layer.

14. A semiconductor device, comprising:
a diffusion barrier structure, wherein the diffusion barrier structure comprises a first TaN layer, a second TaN layer over the first TaN layer, and a tantalum (Ta) layer between the first TaN layer and the second TaN layer, the diffusion barrier structure has a first portion and a second portion surrounding the first portion, and a thickness of the first portion is greater than a thickness of the second portion;
a bottom electrode, over the diffusion barrier structure, wherein the bottom electrode abuts the second TaN layer, the bottom electrode has a first portion over the first portion of the diffusion barrier structure and a second portion over the second portion of the diffusion barrier structure;
a top electrode, over the bottom electrode;
a switching layer, between the bottom electrode and the top electrode, and configured to store data; and
a capping layer, between the switching layer and the top electrode, wherein a thermal conductivity of the diffusion barrier structure is greater than approximately 20 watts per meter kelvin (W/mK), and wherein in a direction perpendicular to a surface of the top electrode, a thickness of the first portion of the bottom electrode is equal to a thickness of the second portion of the bottom electrode.

15. The semiconductor device of claim 14, wherein a thickness of the Ta layer is greater than a thickness of the first TaN layer, and greater than a thickness of the second TaN layer.

16. The semiconductor device of claim 15, wherein the thickness of the Ta layer is greater than a sum of the thicknesses of the first TaN layer and the second TaN layer.

17. The semiconductor device of claim 3, wherein the bottom electrode has a first portion over the first portion of the diffusion barrier structure and a second portion over the second portion of the diffusion barrier structure, and a thickness of the first portion of the bottom electrode is equal to a thickness of the second portion of the bottom electrode.

18. The semiconductor device of claim 5, wherein a sidewall of the bottom electrode has an inclined portion, and the inclined portion of the bottom electrode is coupled to the inclined portion of the switching layer.

19. The semiconductor device of claim 14, wherein a sidewall of the switching layer has an inclined portion, a vertical portion and a horizontal portion coupled with the vertical portion and the inclined portion.

20. The semiconductor device of claim 19, wherein a sidewall of the bottom electrode has an inclined portion, and the inclined portion of the bottom electrode is coupled to the inclined portion of the switching layer.

* * * * *